US005148363A

United States Patent [19]

Sakamoto et al.

[11] Patent Number: 5,148,363

[45] Date of Patent: Sep. 15, 1992

[54] BREAKDOWN DIAGNOSING METHOD OF PRODUCTION LINE

[75] Inventors: Shunji Sakamoto; Toshihiko Hoshino, both of Hiroshima, Japan

[73] Assignee: Mazda Motor Corporation, Hiroshima, Japan

[21] Appl. No.: 498,744

[22] Filed: Mar. 26, 1990

[30] Foreign Application Priority Data

Mar. 25, 1989 [JP] Japan ................................ 1-072248
Dec. 11, 1989 [JP] Japan ................................ 1-321063
Feb. 9, 1990 [JP] Japan ................................ 2-030379

[51] Int. Cl.[5] .............................................. G06F 15/46

[52] U.S. Cl. .................................. 364/143; 364/147; 364/468

[58] Field of Search ............... 364/140, 141, 143, 147, 364/468, 469, 474.11; 371/60, 61, 62

[56] References Cited

U.S. PATENT DOCUMENTS 4,183,462 1/1980 Hideshima et al. .................. 371/60
4,670,834 6/1987 Byal et al. .......................... 364/186
4,683,549 7/1987 Takaki ............................... 364/147
4,858,102 8/1989 Lorenich ............................ 364/147

FOREIGN PATENT DOCUMENTS 0176655 4/1986 European Pat. Off. .
2077966 12/1981 United Kingdom .

OTHER PUBLICATIONS

English Language Abstract of Published Japanese Appln. No. 63-254501, published Oct. 21, 1988, "Sequence Controller", M. Takagi.
English Language Abstract of Published Japanese Appln. No. 63-257054, published Oct. 24, 1988, "Fault Diagnosing System", H. Kato.

*Primary Examiner*—Jerry Smith
*Assistant Examiner*—Paul Gordon
*Attorney, Agent, or Firm*—Wenderoth, Lind & Ponack

[57] ABSTRACT

A breakdown diagnosing method prevents erroneous diagnosis of abnormalities and malfunctions in an operating system, particularly a production line. The fact that an abnormal state of the equipment is not accompanied by a malfunction can be detected. In the event the operating system equipment is actually in the abnormal operating state, an abnormal block and an abnormal operating step in the abnormal operating block of operations executed by the equipment can be promptly and correctly specified. Moreover, the concrete position of the abnormality can also be detected. The breakdown diagnosing method applied to an automatic program forming device can achieve a reduction in the number of processes in forming a sequential control program.

18 Claims, 27 Drawing Sheets

BREAKDOWN DIAGNOSING METHOD OF PRODUCTION LINE

BACKGROUND OF THE INVENTION

1. Field of the Invention

The present invention relates to a method for diagnosing breakdowns in a production line.

2. Description of the Prior Art

A so-called sequential control has been generally well known and is a method for sequentially controlling an operating system of equipment in accordance with operating programs for every output means (for example, an actuator) constituting the operating system. Meanwhile, in order to allow this sequential control to fully function, various arrangements have been made to supervise the controlling state to thereby diagnose an occurrence of an accident or breakdown of the equipment. For one example of such an arrangement, Japanese Patent Application Laid-open Publication 60-238906 discloses an abnormal operation detecting device of a so-called teaching playback method. In this prior art abnormal operation detecting device, an operating pattern for each component in a sequential controlling circuit of the equipment when the equipment is normally operated is stored in advance, so that the stored operating pattern is sequentially compared with a pattern obtain during actual operation of the equipment. Therefore, when the patterns, i.e., the stored normal pattern and actually-obtained pattern are not coincident, the detecting device determines that something is abnormal in the equipment.

The diagnosing method of accidents in the teaching playback manner employed in the above-described device has, however, such a drawback that an operating pattern, if it is not coincident with the pattern stored in the device, is diagnosed to be abnormal even when the equipment is actually normally operating. In other words, although the pattern indicative of the normal operation of the equipment is possibly diversified, a pattern of the equipment to be stored in the device is restricted (generally, only one kind of pattern is stored), and accordingly, it cannot be avoided that any pattern different from the stored pattern is diagnosed abnormal. As a result, the detection or diagnosis may often result in error.

Moreover, according to the prior art diagnosing method, generally, one sequence circuit is formed for one actuator so as to detect abnormalities. The diagnosis of breakdowns or abnormalities is done for every individual actuator, based on which the equipment is diagnosed as a whole. Because of this structure, an abnormality detecting circuit for the control unit should have equal or greater capacity than the control unit, resulting in a bulky and complicated construction. Moreover, it is laborious that when some alterations are made on the equipment, then, the diagnosing program should be changed simultaneously. Even when the actuator is not so greatly damaged and accordingly does not affect the entire operation of the equipment, e.g., a secular change causes some delay in the operation of the actuator, the equipment itself is erroneously diagnosed to be abnormal. Furthermore, when the cycle time of the equipment is disturbed because of an inadvertent manipulation by an operator, but without bringing the actuator into disorder, the fact cannot be detected by the prior art diagnosing method.

SUMMARY OF THE INVENTION

An essential object of the present invention is to provide a diagnosing method of equipment in a production line, in which various equipment operations to be conducted thereby are classified into a plurality of operation blocks, said operation blocks being a unit of a series of operations independently carried out from the start to finish thereof at a normal state, and each operation block being classified into a plurality of operation steps, so that the equipment is sequentially controlled so as to carry out the operation steps in each block in accordance with the predetermined order, the method comprising the steps of measuring the operation time from the start to finish of the series of operation steps in each block, comparing the measured operation time with a reference operation time for the subject block to thereby diagnose the presence or absence of an abnormality in each block, and specifying a broken block and a broken step from contents of a memory means provided in each block for storing the completion of operation in each step.

A second object of the present invention is to provide a diagnosing method of equipment in a production line, in which various production line operations to be conducted by the equipment are classified into a plurality of operation groups, said operation groups being a unit of a series of operations independently carried out from the start to finish thereof at a normal state, and each operation group being classified into a plurality of operation blocks, so that the production line is sequentially controlled so as to execute the plurality of operation blocks in each group in accordance with the predetermined order, the method comprising the steps of measuring the operation time from the start to finish of the series of operation blocks in each group, comparing the measured operation time with a reference operation time for the subject group to thereby diagnose the presence or absence of an abnormality in each group, and specifying a broken group and a broken block from contents of a memory means provided in each group for storing the completion of operation in each block.

According to one aspect of the present invention, the operation time measured for each operation block is compared with a reference operation time. Therefore, it becomes possible to specify an operation block containing abnormal factors. Moreover, since the memory means is provided in each block for storing the completion of operation in each operation step, an operation step causing the breakdown in the block can be advantageously- specified. Furthermore, according to the one aspect, the operation time from the start to finish of a series of operation steps in each operation block is arranged to be measured and compared with a reference operation time for the subject block. Therefore, such abnormalities not affecting the function or entire operation of the subject block among those abnormalities and pattern differences found in the block are effectively prevented from being erroneously detected as abnormal. Even when the subject block is brought into the abnormal operating state without any abnormalities in each element in the block, the abnormal state of the block can be positively detected. Accordingly, the present invention can achieve prompt and correct diagnosis of the presence or absence of abnormalities in the production line and, also prompt and correct detection of abnormal positions in the line.

According to the second aspect of the present invention, because of the arrangement for comparison between the measured operation time and a reference operation time for each operation group, an operation group containing an abnormal factor can be specified. Moreover, an abnormal operation step causing the breakdown of the production line can be specified by the contents in the memory means storing the completion of operation in each operation block of the group. In addition, since the presence or absence of an abnormality in each operation group is diagnosed from the comparison between the operation time from the start to finish of a series of operation blocks in the group with a reference operation time for the group, the same effect as exhibited in the the above-described first aspect can be gained. Thus, the presence or absence of an abnormality in the production line and an abnormal position therein can be promptly and correctly detected.

BRIEF DESCRIPTION OF THE DRAWINGS

These and other objects and features of the present invention will become clear from the following description taken in conjunction with preferred embodiments thereof with reference to the accompanying drawings, in which.

DESCRIPTION OF THE PREFERRED EMBODIMENTS

Figure 1:
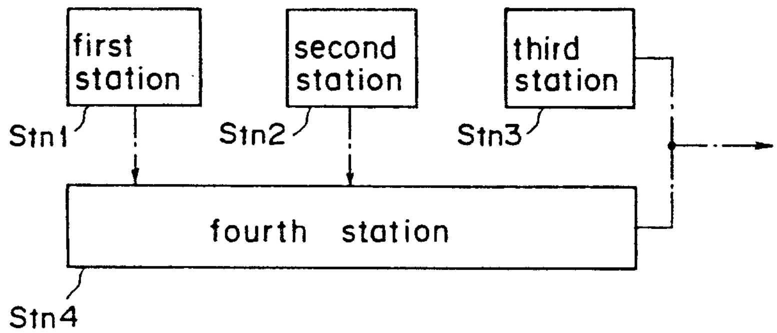
FIG. 1 is a diagram schematically showing the structure of one example of a production line for explaining the fundamental concept of operation groups, operation blocks and operation steps used in the present invention.

Before the description of the present invention proceeds, it is to be noted here that like parts are designated by like reference numerals throughout the accompanying drawings.

The following description is related to a first embodiment of the present invention. According to the first embodiment, a breakdown diagnosing method is applied to an assembling apparatus for mounting suspensions or like components and an engine into the body of an automobile in an assembling line.

Figure 10:
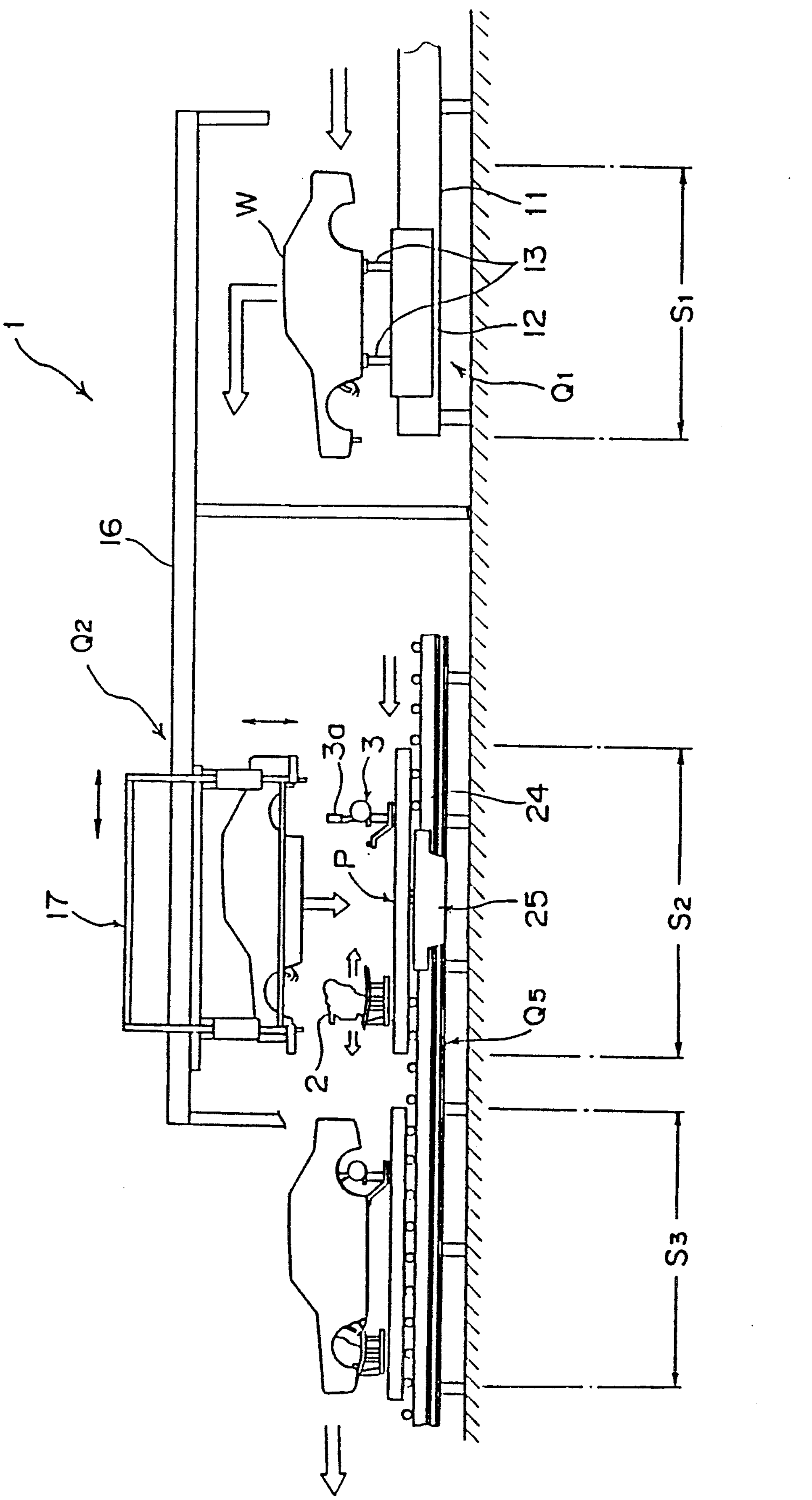
FIG. 10 is a schematic front elevational view showing the total structure of the assembling apparatus according to the first embodiment.

Referring first to FIG. 10, an assembling apparatus 1 is provided with a positioning station S1, a docking station S2 and a screwing station S3. An automobile body W is carried into positioning station S1 from a previous process to be arranged in a positioning state. Then, the body W is installed and docked with an engine 2 placed at a predetermined position on a pallet P and such components as front and rear suspensions 3 (only the rear suspension is shown in FIG. 10), etc. in docking station S2. After the body is docked, the engine 2 and suspensions 3 are tightened up in screwing station S3. An overhead transfer device Q2 is provided between stations S1 and S2, so that the body W is transferred from station S1 to station S2 while it is suspended. Moreover, a carrier device Q5 is provided between stations S2 and S3 for carrying the pallet P.

A relay stand 12 is mounted in station S1 which runs to and fro along a rail 11 so as to send the body W fed from the previous process to a starting end of transfer device Q2. The relay stand 12 has a plurality of body receiving elements 13 for supporting the lower part of the body W. The receiving elements 13 are movable up and down. In station S1, there is further mounted a positioning device Q1 although it is not concretely shown in FIG. 10. The positioning device Q1 is comprised of a positioning means for positioning relay stand 12 at a predetermined position in a front-and-rear direction, a positioning means for positioning receiving elements 13 at a predetermined position in an up-and-down direction and a reference pin for positioning the body W at the relay stand 12, etc.

Figure 11:
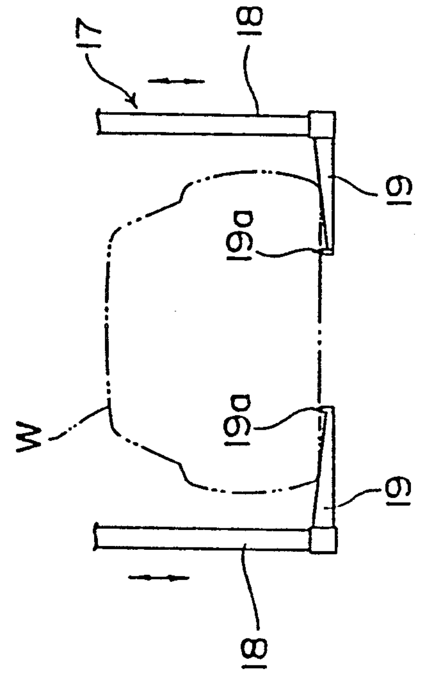
FIG. 11 is a side elevational view of a holding arm of a carrier.

The transfer device Q2 consists of a guide rail 16 which is extended over stations S1 and S2 to connect therebetween, and a carrier 17 which reciprocally runs in a suspended state along the guide rail 16. As indicated in FIG. 11, the carrier 17 is provided with a hanger arm 18 which is manipulated up and down, and body holding arms 19 at lower four corners of the hanger arm 18 in a retractable and swinging manner. Each of these holding arms 19 is allowed to swing, for example, by an air cylinder (not shown), and has an engaging pin 19*a* at an end portion thereof which is to be engaged with the body W.

Figure 12:
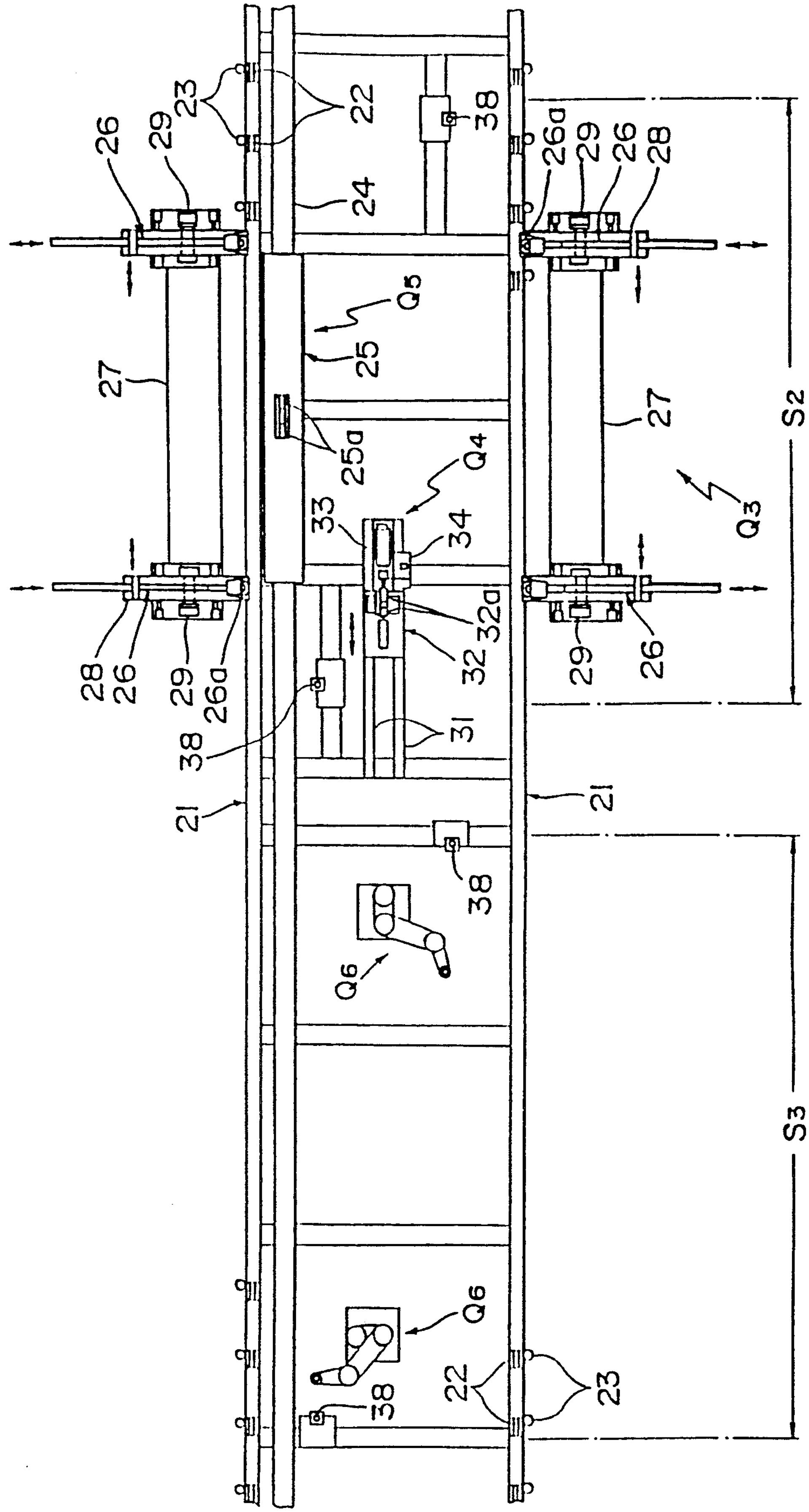
FIG. 12 is a plane view of a docking station and a screwing station.

As indicated in FIG. 12, the pallet carrier device Q5 connecting the docking station S2 and screwing station S3 is provided with a pair of right and left guide portions 21 which have many supporting rollers 22 for receiving right and left lower ends of pallet P and many side rollers 23 for guiding right and left lateral surfaces of pallet P, a carrier rail 24 extending in parallel to the guide portions 21 and, a pallet holding portion 25*a* for securely holding pallet P. The pallet carrier device Q5 also includes a pallet carrier platform 25 provided in a manner to be movable along the carrier rail 24.

Although it is not clearly seen from the drawing, guide portions 21, 21 and carrier rail 24 are formed in a loop starting from a component feed station (not shown) where the engine 2 and suspension 3, etc. are supplied to the assembling apparatus 1, passing through docking station S2, screwing station S3, and a carrier station (not shown) where the body W finished with screwing work is transferred to a subsequent process to return to the component feed station (not shown). A plurality of pallet carrier platforms 25 on the carrier rail 24 are circulated by a predetermined cycle.

Front and rear clamp arms 26 in pairs are placed in docking station S2 at positions corresponding to where the front and rear suspensions 3 are mounted, so that a damper unit 3*a* (referring to FIG. 10) which is in a floating state until it is mounted in body W when the suspension 3 is installed is held at a predetermined posture for docking. The guide portions 21 are intervened between the pair of clamp arms 26. Each clamp arm 26 has a hook 26*a* at its end portion for clamping damper unit 3*a*, and is mounted in a mounting base 27 provided at the lateral sides of guide portions 21, 21, through a mounting plate 28 in a retractable manner in a right-and-left direction (widthwise direction of the automobile). An arm slide 29 is attached to the mounting plate 28 in order to slide the same in a front-and-rear direction. The arm slide 29 is, e.g., an air cylinder. Because of the arm slide 29, the damper unit 3*a* is allowed to move right and left and, front and rear while it is clamped. In other words, the clamp arms 26 and arm slides 29 form a part of a docking device Q3 which docks the engine 2 and suspension 3 with the body W.

Moreover, in the docking station S2, a pair of right and left slide rails 31 are placed in parallel to guide portions 21 of the pallet carrier device Q5. A movable body 32 slides along the slide rails 31 in a front-and-rear direction by an electric motor 33. The slide rails 31, movable body 32 and electric motor 33 constitute a slide device Q4. As will be described later in detail, when the engine 2 on the pallet P is moved in a front-and-rear direction by the slide device Q4, the body W can be prevented from being interfered with by the engine 2 when they are docked.

A plurality of robots Q6 are arranged in the screwing station S3 so as to tightly screw the engine 2 and suspensions 3, etc. to the body W. At the same time, a plurality of pallet reference pins 38 are so provided as to be movable up and down. The fed pallet P is positioned and locked at a predetermined position by the reference pins 38. The same pallet reference pins as those pins 38 are also provided in the docking station S2.

Figure 13:
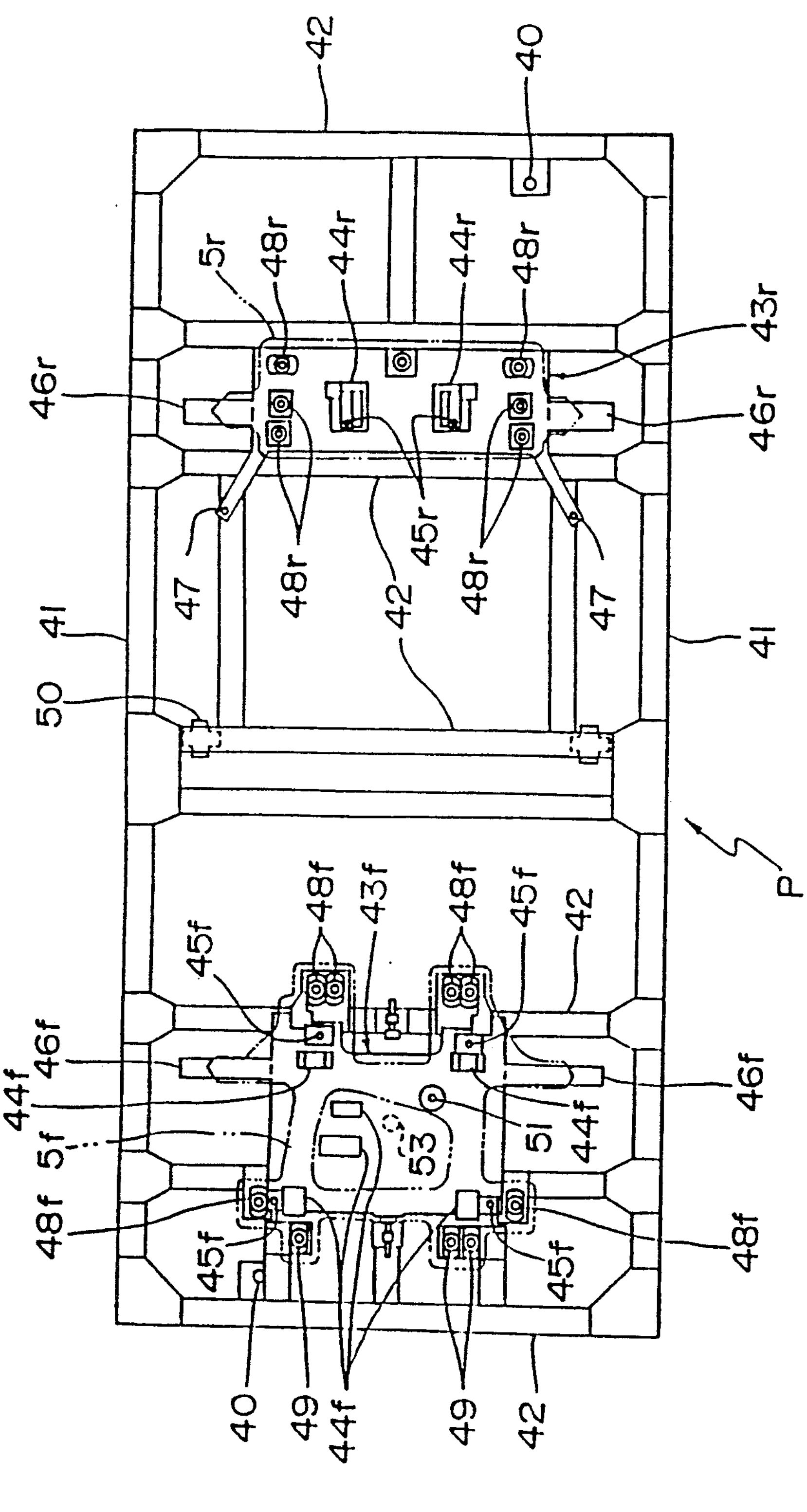
FIG. 13 is a plane view of a pallet.

The pallet P is, as shown in FIG. 13, formed in a ladder-like shape by a pair of longitudinal frames 41 extending in a front-and-rear direction and many lateral frames 42 stretching out between the frames 41. In the vicinity of the front and rear end portions of the pallet P are formed a plurality of engaging holes 40 to be engaged with the pallet reference pins 38. Further, in the vicinity of the lateral sides at the central part of the pallet P in a front-and-rear direction are formed to-be-engaged portions 50 which are to be engaged with the engaging portions 25*a* of the pallet carrier platform 25.

Figure 14:
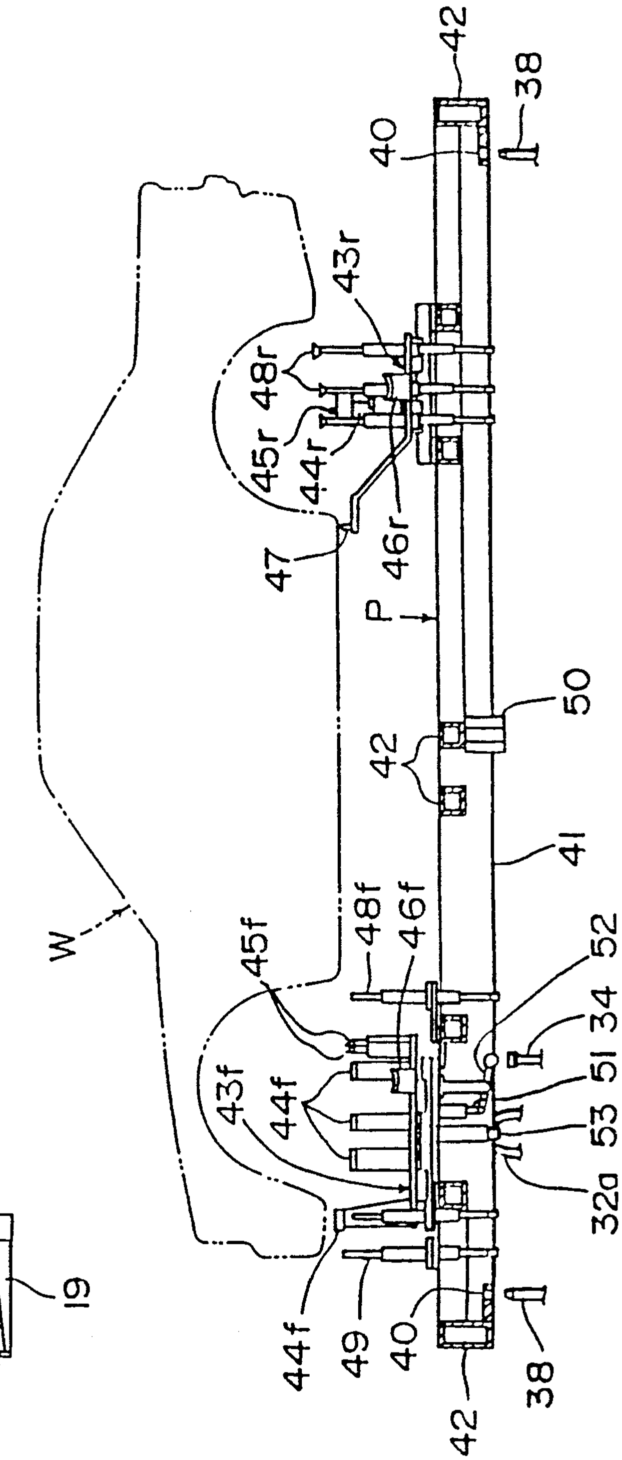
FIG. 14 is a side elevational view of the pallet.

A front supporting base plate 43*f* is provided in the front part of the pallet P so as to support a front base frame 5*f* on which are placed the engine 2, front suspension (not shown) and the like. On the other hand, a rear supporting base plate 43*r* is provided in the rear part of the pallet P so as to support a rear base frame 5*r* having the rear suspension, etc. placed thereon. As indicated in FIG. 14, the front and rear supporting base plates 43*f* and 43*r* have a plurality of supporting members 44*f*, 44*r* for supporting the base frames 5*f*, 5*r* or body W, a plurality of positioning pins 45*f* and 45*r* for positioning base frames 5*f*, 5*r* at supporting base plates 43*f*, 43*r*, and body receiving elements 46*f*, 46*r* for supporting the body W through a bracket (not shown), etc. respectively. The rear supporting base plate 43*r* is further provided with a plurality of body positioning pins 47 for positioning the body W on the pallet P, and many nut holders 48*r* which hold nuts to be screwed in the screwing station S3.

Meanwhile, similar nut holders 48 and bolt holders 49 to those provided in the rear part of the pallet P are directly attached to the pallet P in the front part thereof. A lock pin 51 is provided so as to lock the front supporting base plate 43*f* at a predetermined position. It is possible to switch the lock pin 51 in an urged state to the engaging side by a spring (not shown) or to the releasing side by a releasing lever 52. Further, the front supporting base plate 43*f* is integrally formed with an engaging member 53 extending downwards which is engaged with an engaging hook 32*a* provided at the upper surface of the movable body 32 (FIG. 12) of the slide device Q4. The slide device Q4 is additionally provided with an air cylinder 34 so as to move the releasing lever 52 to the releasing side. When the body W is to be descended towards the docking station S2, the releasing lever 52 is manipulated and released in accordance with a predetermined descending timing of the body W, and accordingly the lock pin 51 becomes disengaged. Since the front supporting base plate 43*f* (namely, engine 2) is subsequently moved in a front-and-rear direction by the slide device Q4 through the engaging member 53, the body W can be prevented from being interfered with by the engine 2.

As is made clear from the foregoing description, the assembling apparatus 1 according to the present embodiment is comprised of the positioning device Q1, transfer device Q2, docking device Q3, slide device Q4, pallet carrier device Q5 and screwing robot Q6 as main output components constituting the operating system. These output components are sequentially controlled in accordance with programs arranged beforehand.

In the first embodiment, various operations to be carried out by the equipment in the production line are classified into a plurality of operation groups, the operation groups being a unit of a series of operations carried out from the start to finish thereof independently at a normal state, and at the same time, each operation group is further classified into a series of operation blocks carried out independently from the start to finish thereof at a normal state. Moreover, each operation block is classified into a plurality of operation steps. In the above-described structure, the equipment is controlled by a sequential program such that the plurality of operation steps in each operation block are sequentially executed in accordance with the predetermined order, and the plurality of operation blocks in each operation group are sequentially carried out in accordance with the predetermined order.

Before the assembling apparatus 1 in the automobile assembling line is concretely depicted hereinbelow, the fundamental concept of the above-described operation groups, operation blocks and operation steps will be explained first.

Referring to FIG. 1, one example of a production line is schematically illustrated for explaining the fundamental concept of the operation groups, operation blocks and operation steps. The production line is fitted with a continuous conveyor line and a plurality of linear transfer lines which carries in and out components, products, etc. by a tact transfer method to the continuous conveyor line. Each transfer line forms an independent station. As shown in FIG. 1, for example, a first station Stn1 and a second station Stn2 are arranged for a fourth station Stn4 which is constituted by a continuous conveyor line, so that components and products, etc. are carried into the fourth station Stn4 therefrom. At the same time, a third station Stn3 is also arranged for the fourth station Stn4 so that the components and products, etc. are transferred to a succeeding station for a next process (not shown) in accordance with the timing with which the components, etc. are carried out from the fourth station Stn4. If the operations in the first and second stations Stn1 and Stn2 are normally carried out, the fourth station Stn4 becomes operable. Moreover, if the operations are normally carried out in the fourth and third stations Stn4 and Stn3, then the succeeding station (not shown) is rendered operable.

Figure 2:
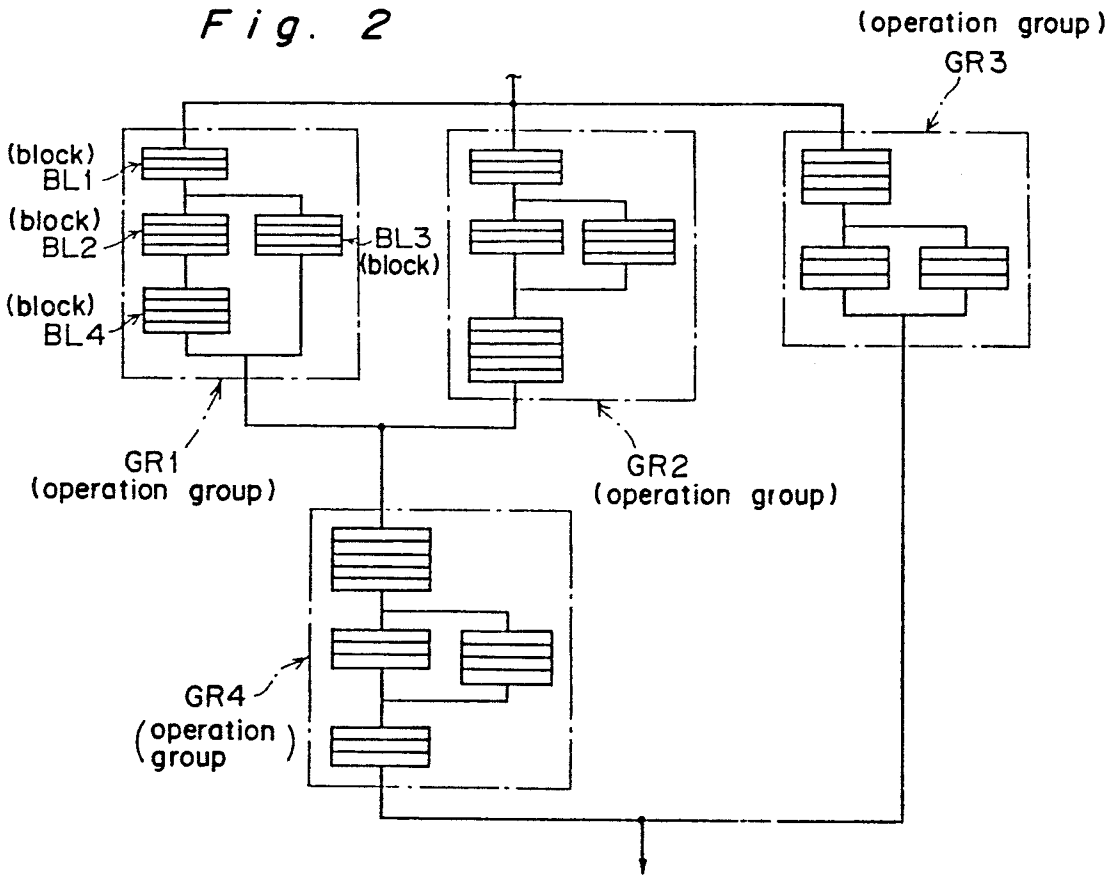
FIG. 2 is a flow-chart showing various operations in the production line classified into operation groups, operation blocks and operation steps.

Referring now to FIG. 2, various operations respectively executed in each of the above stations Stn1, Stn2, Stn3 and Stn4 form operation groups GR1, GR2, GR3 and GR4 as a unit of a series of operations independently carried out from the start to finish thereof at the normal state. Each operation group GR1, GR2, GR3 or GR4 is divided into a plurality of operation blocks as a unit of a series of operations independently carried out from the start to finish thereof at the normal state, which block is further divided into a plurality of operation steps.

More specifically, by the example of the operation group GR1 (a first operation group) consisting of a series of operations in the first station Stn1, the group GR1 is divided into operation blocks BL1, BL2, BL3 and BL4, and each of these blocks is divided into a plurality of operation steps. It is to be noted that it may be possible that the operation group is formed of a single operation block, or the operation block is substantially formed of a single operation step.

The operation steps in each operation block are sequentially executed, and the operation blocks in each operation group are sequentially executed, and further operation groups GR1, GR2, GR3 and GR4 are sequentially executed, in a predetermined order in accordance with a sequential controlling program.

Figure 3:
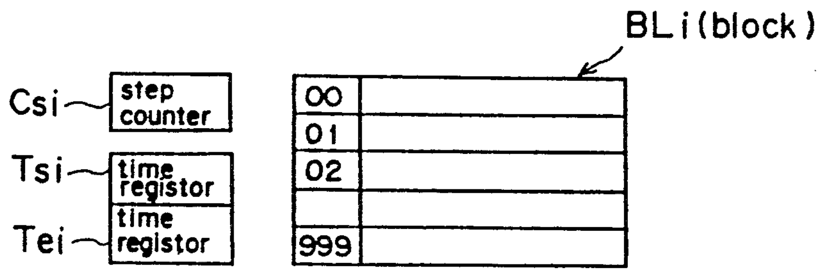
FIG. 3 is a schematic view of the operation block provided with a step counter and a time register.

Hereinbelow, the basic idea of the breakdown diagnosing method in a production line of the present invention will be explained. As shown in FIG. 3, every operation block BL1 in the diagnosing device is provided with a step counter Csi and time registers Tsi and Tei. In the step counter Csi, steps executed in the operation steps in the block are inputted. On the other hand, in the time registers Tsi and Tei, a timer value at the start of operation in the block BLi and a timer value at the end of operation in the block BLi are respectively inputted on the basis of a time indicated by a clock built in a microcomputer of the diagnosing device.

The operation time Txi ($=Tei-Tsi$) spent from the start to finish of a series of operation steps in the block BLi is calculated from the data inputted in the time registers Tsi and Tei, which is then stored in a memory in the microcomputer. Meanwhile, a reference time Tsti ($=Txim+3\sigma$) for the block BLi which is determined by the average time Txim and standard deviation $\sigma$ of the measured operation time measured at the normal operating time for a predetermined number of cycles is inputted beforehand in the microcomputer. It is more preferable if the reference time data is updated every cycle. Accordingly, the presence or absence of an abnormality in the block BLi can be diagnosed by comparing the reference time Tsti and the measured operation time Txi. In other words, when the measured operation time is not larger than the reference time Tsti, it is so diagnosed that the block operates normally. On the contrary, when the measured operation time exceeds the reference time Tsti, the operation of the block BLi is diagnosed abnormal.

In the event block BLi is found abnormal, a count value of the step counter Csi in the block BLi is read, whereby the abnormal operation step can be specified. That is, an operation step following an operation step which has completed operating to thereby have a step number counted by the step counter Csi is specified as a broken step. Thereafter, the abnormal operation step is searched in a reverse direction in the sequence circuit, so that a broken contact point can be concretely identified on the ladder diagram.

Figure 4:
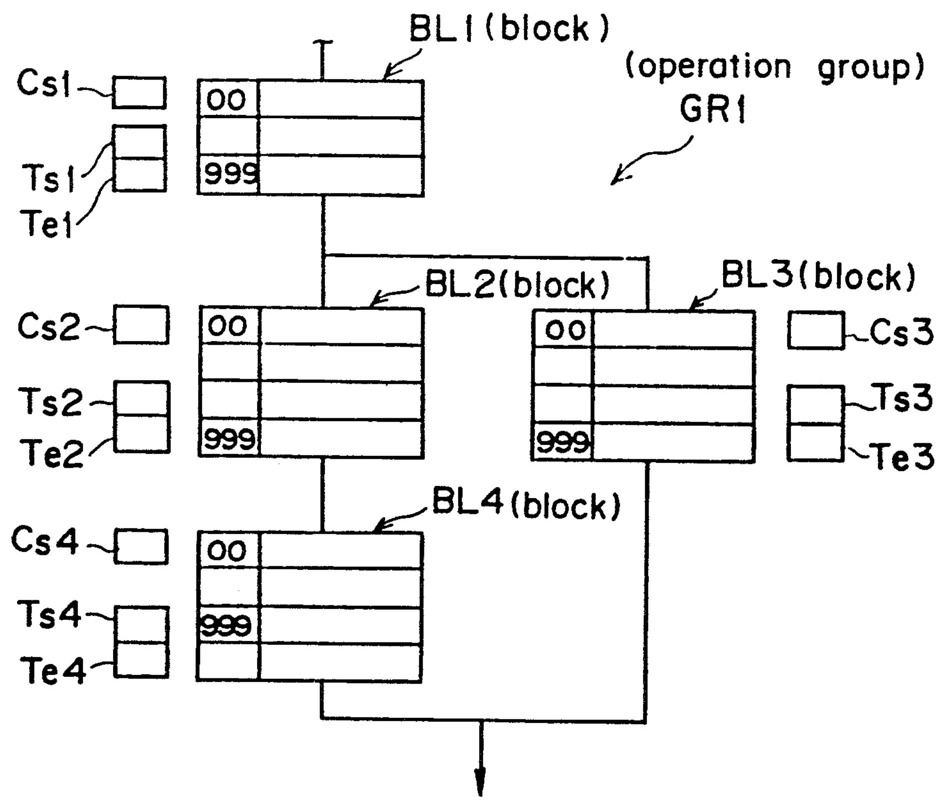
FIG. 4 is an enlarged flow-chart showing various operations in a first operation group in the production line classified into operation blocks and operation steps.

Taking one example of the first operation group GR1 consisting of a series of operations to be carried out in the first station Stn1 of the production line (FIGS. 1 and 2), as seen from FIG. 4, operation blocks BL1, BL2, BL3 and BL4 are fitted with step counters Cs1, Cs2, Cs3 and Cs4, and time registers Ts1/Te1, Ts2/Te2, Ts3/Te3 and Ts4/Te4, respectively. When the operation times Tx1, Tx2, Tx3 and Tx4 for respective operation blocks BL1, BL2, BL3 and BL4 which are inputted from the data of the time registers and stored in the memory of the microcomputer are compared with reference times Tst1, Tst2, Tst3 and Tst4 for respective blocks, the occurrence of a breakdown in each block is monitored.

Although it is not concretely indicated in the drawings, each operation group Gr1, Gr2, Gr3 or Gr4 is provided with a time register in order to measure the operation time from the start to finish of operations in the group. Therefore, when the measured operation time is monitored through comparison with a reference time for the group, an abnormality can be diagnosed for each group. Furthermore, if a count value of a step counter which is provided in each block of the group is detected for the abnormal group, a block representing a number except the number indicative of the completion of operation in the block ("999") can also be found, which is accordingly specified an abnormal block. Moreover, an abnormal step can also be specified by a count value of the step counter.

The assembling apparatus 1 of the automobile assembling line will be discussed with reference to a concrete example thereof (FIGS. 10-14).

Figure 5:
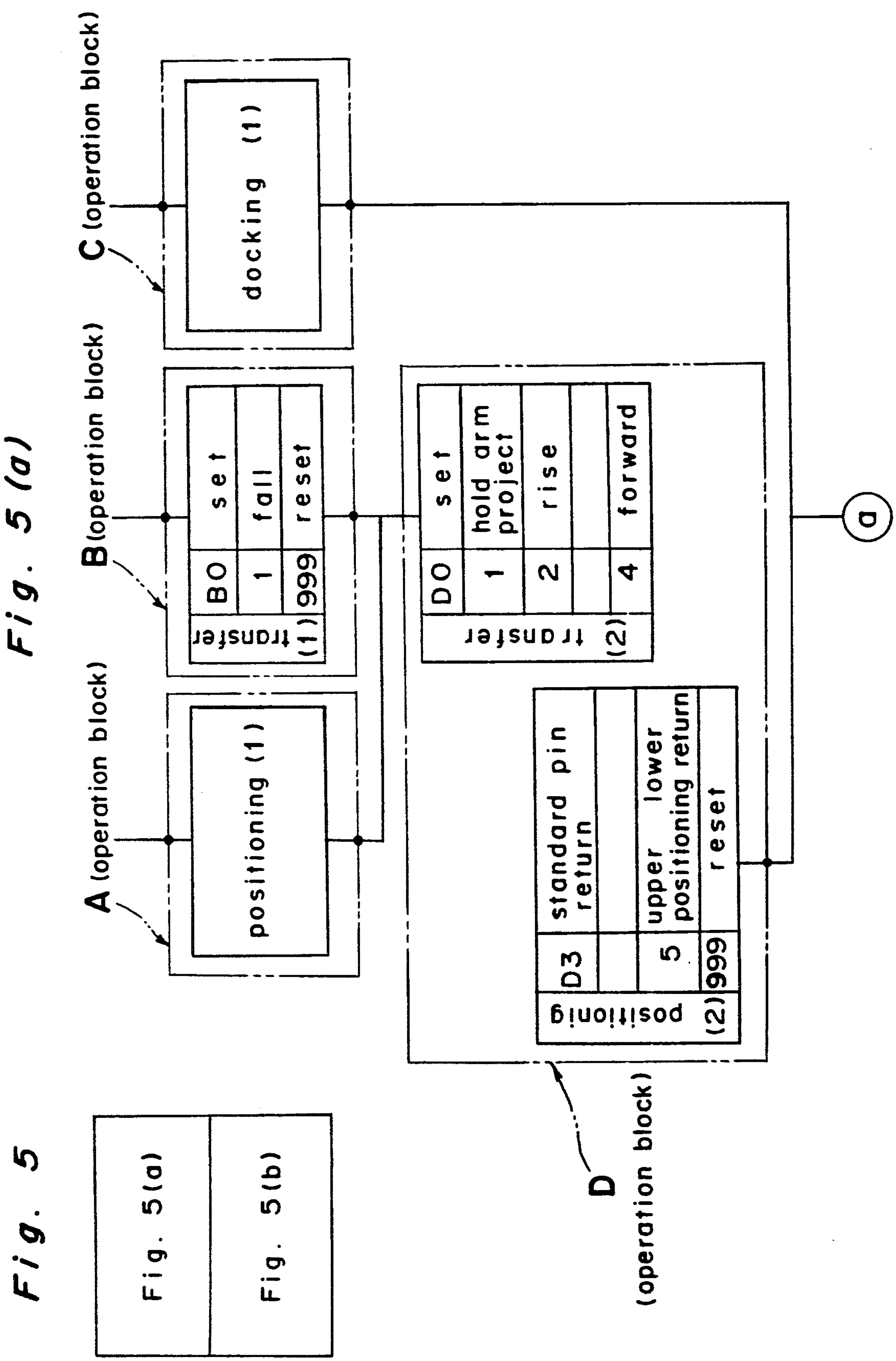
FIGS. 5(*a*) and 5(*b*) are flow-charts showing the operation block and operation step for explaining the operation of an assembling apparatus according to a first embodiment of the present invention.
Figure 5:
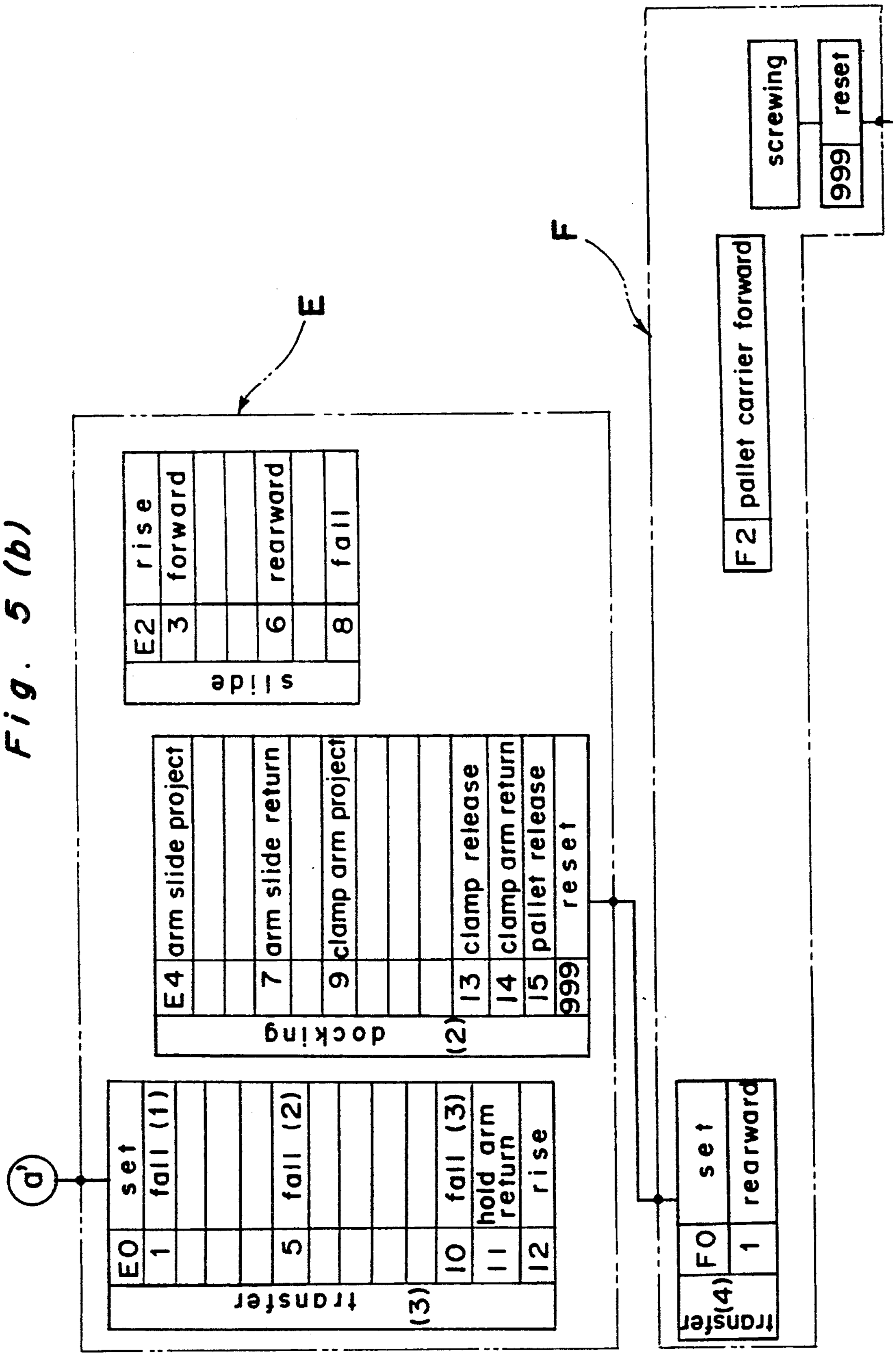

A flow-chart of FIG. 5 shows the executing order of operations, for example, mainly of the transfer device Q2 in the operating system of assembling apparatus 1 as well as the operation blocks as a unit of a series of operations independently carried out from the start to finish thereof at the normal state of the apparatus. As indicated in FIG. 5, operations to be carried out in each operation block are classified into a plurality of operation steps each step executed in a fixed order. In each classified operation block, operation steps are executed from the first to last independently and separately from operation steps in the other operation blocks without any interference therebetween.

In the present embodiment, the operation steps of each output component in the operating system of apparatus 1 are divided into 6, that is, A through F operation blocks. In FIG. 5, there are shown operation blocks of the positioning device Q1, of the transfer device Q2, of the docking device Q3, of the slide device Q4, of the pallet carrier device Q5 and of the screwing robot Q6. More specifically, the operation steps of positioning device Q1 are contained in A and D blocks, those of transfer device Q2 in B, D, E and F blocks, those of docking device Q3 into C and E blocks, those of slide device Q4 in E block, and those of pallet carrier device Q5 and screwing robot Q6 in F block. The executing order has been determined in advance by the program such that the operation blocks proceed in time sequence from above to downwards in FIG. 5.

If a plurality of blocks are indicated on the same line in a horizontal direction in FIG. 5 (referring to A, B and C blocks), it means that these blocks (namely, operation steps in the blocks) are executed in a synchronous manner. On the other hand, if operation steps of a plurality of output components are included in the same block, it indicates that these output components cooperate to execute the operation steps, and the operation steps of output components are combined with each other to determine the executing order of the operation steps in the block (referring to D, E and F blocks).

The operation of the assembling apparatus 1 will be discussed hereinbelow with reference to the flow-chart of FIG. 5.

It is to be noted here that when the assembling apparatus 1 is in the initial state before action, the body W supplied from the previous process is placed, but not strictly positioned, on the moving stand 12 of the positioning station S1, while the moving stand 12 is not positioned at a starting end of the transfer device Q2, and the pallet P is at the docking station S2 in the non-locked state.

When the assembling apparatus 1 is started, first, the positioning device Q1, transfer device Q2 and docking device Q3 start operating concurrently. The positioning device Q1 positions by a series of operating steps in the block A the moving stand 12 in the front-and-rear direction, with body receiving elements 13 in the up-and-down direction and body W on the moving stand 12, respectively, which is a preparatory work for the body W to be held by the carrier 17 of the transfer device Q2 (positioning (1)). The docking device Q3 locks the pallet P at a predetermined position by a series of operation steps in the block C, which is a preparatory work for docking, and at the same time, it maintains the damper unit 3*a* at a predetermined posture by clamp arms 26 to thereby avoid an interference between the body W and suspension 3 when they are docked (docking (1)).

On the other hand, the transfer device Q2 performs transfer (1) by a series of operation steps in the block B. In other words, the carrier 17 starts descending from the initial state where it is positioned overhead at the starting end (operation step B0) to the positioning station S1 (operation step B1). At this time, the body holding arm 19 at the lower end of the carrier 17 is locked at a retracted position to thereby not interfere with the body W. When the operation step B1 is completed, the operation in the block B is finished, with an operating instruction for the transfer device Q2 being reset (operation step B999).

After completion of the entire operation steps in blocks A and B, the operation in block D is started, namely, the positioning device Q1 performs positioning (2) and the transfer device Q2 performs transfer (2). Specifically, the body holding arm 19 of the transfer device Q2 is released from its locking state, and at the same time, the holding pin 19*a*of the arm 19 is advanced to a holding position where it is engaged with the body W (operation step D1). Each body holding arm 19 is locked in this state. Thereafter, the carrier 17 is raised in operation step D2 while it holds the body W. In operation step D3, the reference pin (not shown) of the positioning device Q1 is retracted. In subsequent operation step D4, the carrier 17 is advanced above the docking station S2. Then, the body receiving elements 13 of the positioning device Q1 are lowered in operation step D5, thus completing the whole operation in the block D (completion: operation step D999). It is to be noted that the positioning device Q1 is returned to the initial state after one cycle of operation steps of the assembling apparatus 1 is completed.

When operation steps in the block D are finished, operations in block E are started, i.e., the transfer device Q2 starts transferring (3), docking device Q3 starts docking (2) and slide device Q4 starts sliding. In other words, the body W held by the carrier 17 of transfer device Q2 is gradually descended in three stages towards the docking station S2 (operation steps E1, E5 and E10), and assembled with the engine 2 and suspension 3 on the pallet P. During the descent of the body W, each clamp arm 26 and arm slide 29 of the docking device Q3 move the damper unit 3*a* front and rear, and right and left (operation steps E4, E7 and E9) and also the slide device Q4 moves the engine 2 front and rear (operation steps E2, E3, E6 and E8). Accordingly, an interference between the body W and damper unit 3*a* or engine 2 at the docking time is avoided. After the docking of the body W with the engine 2 and suspension 3, the body holding arm 19 of the carrier 17 is retracted in operation step Ell, thereby completely finishing the docking. Next, the carrier 17 separated from the body W in the operation step E12 is raised, and then, the damper unit 3*a* is released from its clamped state (operation step E13), clamp arm 26 is retracted (operation step E14) and pallet P is released from its locked state (operation step E15). Thus, all the operations in block E are completed (completion: operation step E999).

When the block E is completely executed, the block F is started. The transfer device Q2 starts transferring (4), pallet carrier device Q5 starts carrying, and robot Q6 starts screwing. In other words, the carrier 17 of the transfer device Q2 is returned to the starting end in the initial state in the operation step Fl (operation step B0). In the operating step F2, the pallet P having the docked body W placed thereon is forwarded to the screwing station S3 by the pallet carrier device Q5. The robot Q6 then performs screwing. Thereafter, in the operation step F999, an operating instruction for the transfer device Q2, pallet carrier device Q5 and robot Q6 is reset.

When the block F is finished, the body W assembled with the engine 2 and suspension 3, etc. is carried out from the screwing station S3 to a succeeding process by the pallet carrier device Q5. Simultaneously, another pallet P for a succeeding cycle is set in the docking station S2. Accordingly, the assembling apparatus is returned to the initial state.

Figure 6:
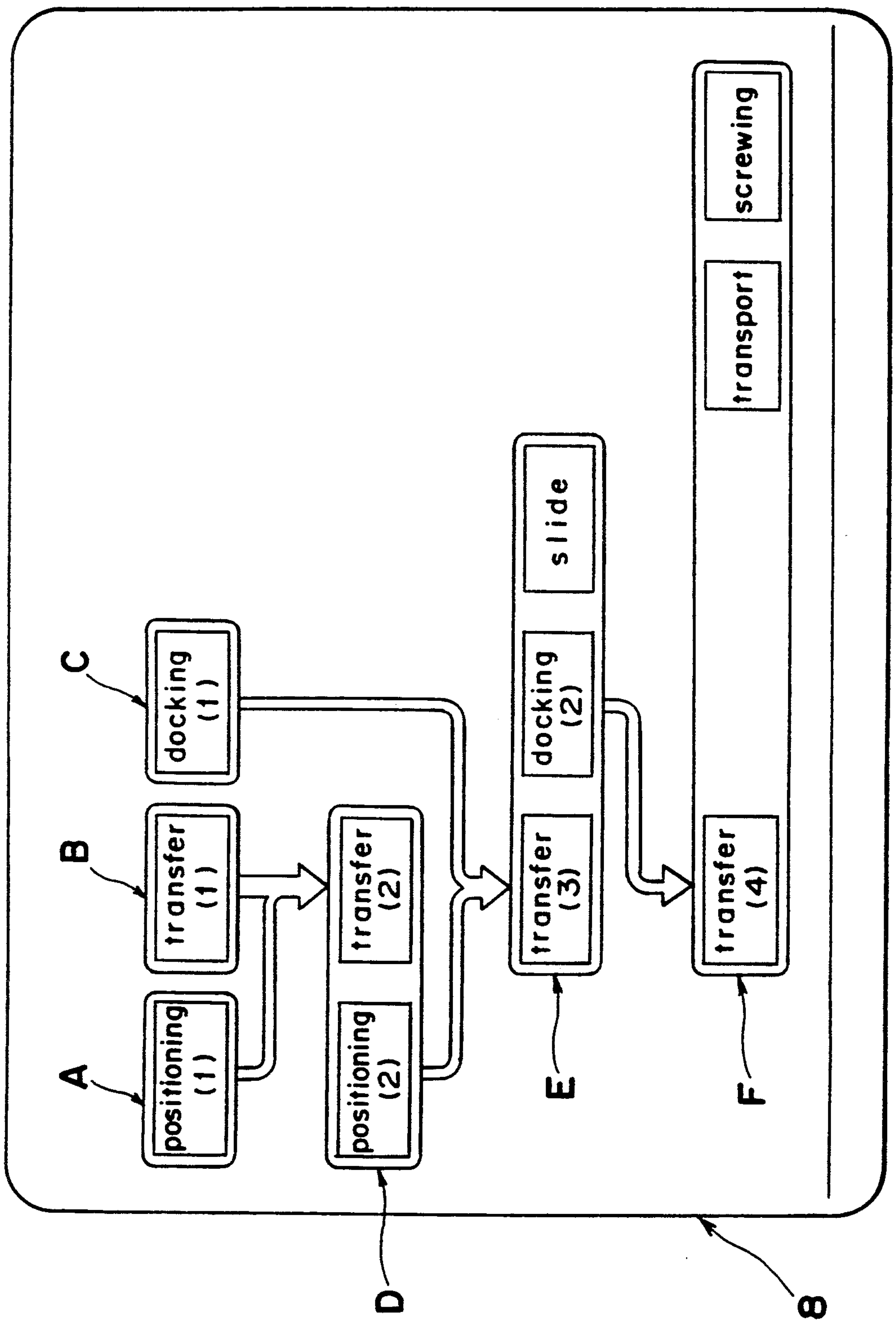
FIGS. 6 and 7 are front elevational views of a monitor screen of a display unit according to the first embodiment of the present invention.
Figure 7:
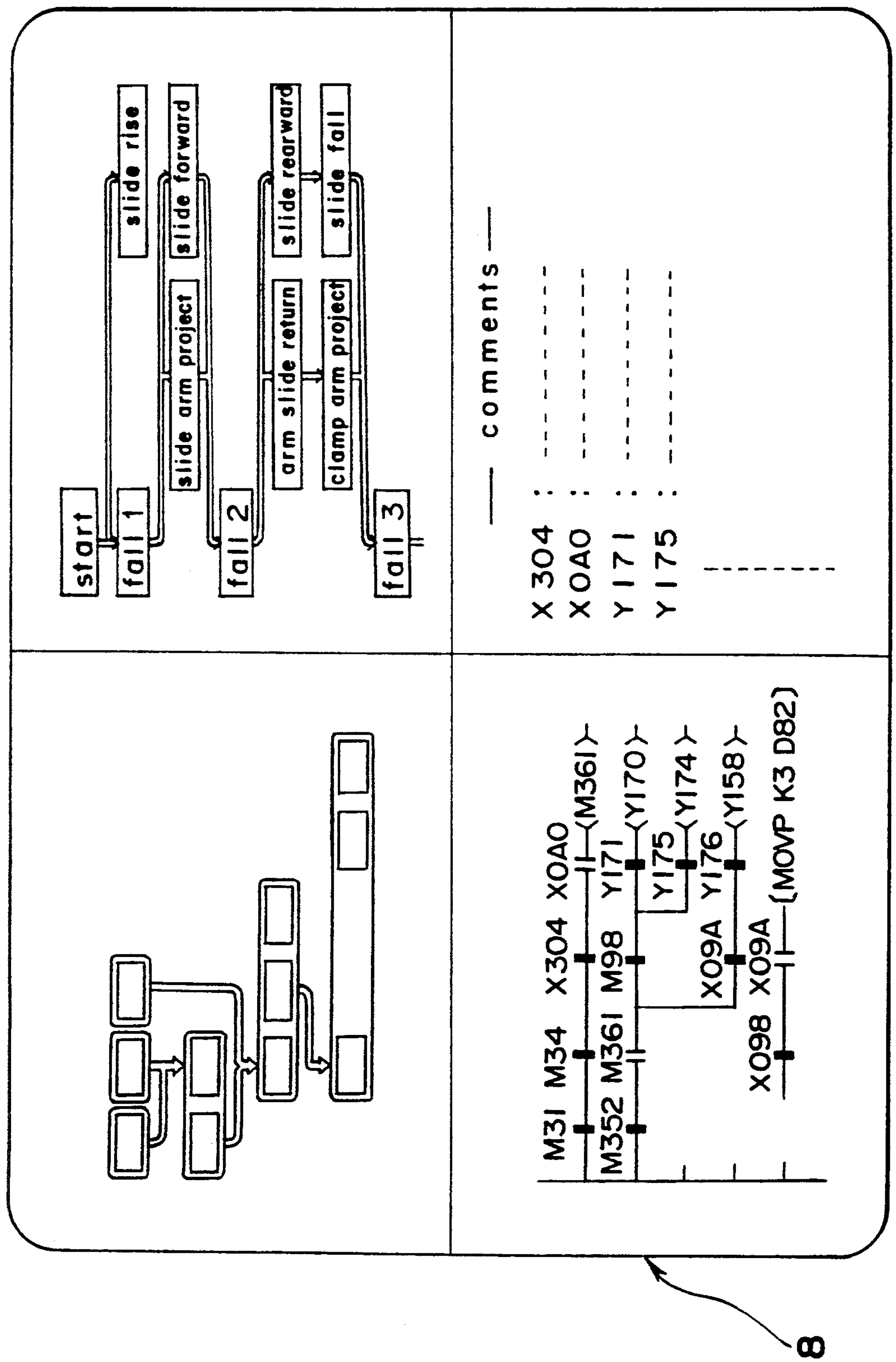

According to the above-described first embodiment, the assembling apparatus 1 is provided with a breakdown diagnosing device designed to monitor whether or not the apparatus 1 operates normally and to search for a broken position at the occurrence of the breakdown. As shown in FIG. 6, a flow-chart represented by the above-described operation blocks is indicated on a screen of a display unit 8 attached to the diagnosing device, so that the whole operating system of the assembling apparatus 1 can be seen from the monitor screen. The blocks before execution are shown colorless on the monitor screen, while those after execution are drawn by a predetermined color. Moreover, the blocks during execution are indicated in a flickering manner. Furthermore, in the case where some accident occurs in the operating system of the apparatus 1, the monitor screen of the display unit 8 is switched as shown in FIG. 7 to show a flow-chart of the whole operating system by blocks, a flow-chart of a series of operation steps constituting the broken block, a ladder diagram of the broken point, and a table indicating names of contacts, etc. on the ladder diagram, all at the same time on the same screen.

In the present embodiment, the transition of the executing block and executing step in the breakdown diagnosing program is controlled by a step counter incorporated in the diagnosing device. This step counter for each block is provided with a memory means for storing respective timer values when the step counter shows "0" and "999".

Figure 8:
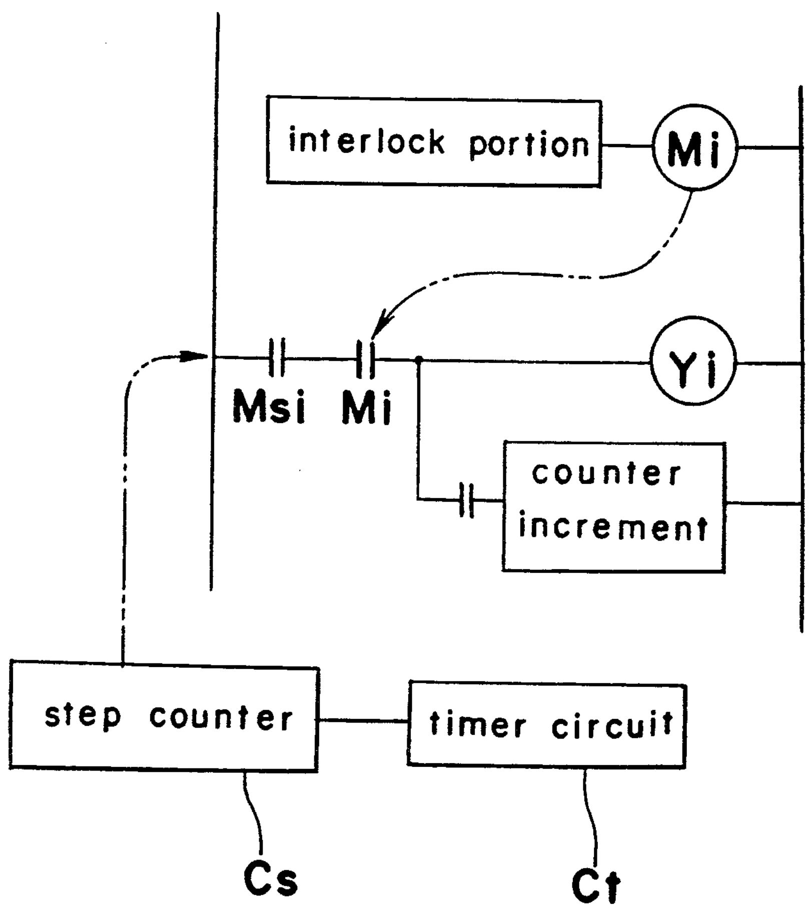
FIG. 8 is a schematic view showing the basic structure of the operation step.

Specifically, as indicated in FIG. 8, each operation step is fundamentally composed of an internal coil Mi of an interlocking section which is turned ON when all the conditions for executing the subject operation step are satisfied, an internal coil Msi which is turned ON when an operating instruction is outputted and an external coil Yi which is turned ON when both the internal coils Mi and Msi are turned ON to thereby produce an output. A count value of the step counter Cs which counts the number (register number) of the executing order of operation steps is arranged to be increased when the internal coils Msi and Mi are both turned ON. Therefore, the portion of the program being executed can be known by monitoring the count value of the step counter Cs. That is to say, not only the operating state of the assembling apparatus 1 can be monitored, but the breakdown can be diagnosed, only with the use of the step counter Cs. Accordingly, even when the sequential program for actuating the apparatus 1 is changed, the program for diagnosing the breakdown is not influenced, thereby reducing labors in the change of the system.

The above-mentioned step counter Cs is provided in each operation block. Every one operation step in the block is finished, the count value of the counter Cs is incremented one, and thereafter, a succeeding step following the completed step is started.

Further, the timer circuit Ct provided for each block can measure the time from when an operating instruction for the operation block is set (register number 0) until it is reset (register number 999), i.e., the operation time from the start to finish of the operations in the block. In comparing the measured operation time with .a reference operation time for the block, the presence or absence of an abnormality or breakdown in the block can be diagnosed.

It is further arranged in the present embodiment that the cycle time of the whole of the operating system of the apparatus 1 is measured, which is in turn compared with a reference cycle time, whereby the presence or absence of an abnormality in the apparatus 1 can be diagnosed.

In determining the reference operation time for each block, a reference value thereof is updated by a learning function every time the time is measured.

More specifically, for example, in measuring the operation time of one operation block, a trial operation is repeated for a predetermined number of times (e.g., about 100 times) before the apparatus 1 is operated, and the average operation time To in the block and the standard deviation $\sigma o$ are calculated. This average operation time To is set as the reference operation time for the first cycle. If the measured operation time t exceeds $T \pm 3\sigma$, T being the reference operation time and $\sigma$ being the standard deviation, the time t is excluded from the calculation of the reference operation time To as an abnormal value.

After the operation block is executed in the first cycle, a fresh average value T1 (reference operation time) and standard deviation $\sigma 1$ are calculated by adding the measured operation time t1 in the first cycle to the data. The calculation is repeated similarly every operating cycle of the apparatus 1. When the (n)th cycle is completed, a fresh reference operation time Tn and standard deviation $\sigma n$ are calculated for the $(n+1)$th cycle. Thus, when the measured operation time for the $(n+1)$th cycle is compared with the reference operation time Tn, and if the measured operation time is within the range of $Tn \pm 3\sigma n$, the measured time is diagnosed normal. On the contrary, if the measured operation time exceeds the range, the time is diagnosed as abnormal. However, even in the case where the measured time is diagnosed abnormal, if the operation of the whole apparatus 1 is normal, only the fact of the abnormality found in the block is recorded, without any alarm indicative of an abnormal operation of the apparatus being generated. The measured time in this case is excluded from the next calculation for a reference operation time and standard deviation of a succeeding cycle.

As is described hereinabove, because the learning function is used for determining the reference operation time according to the present embodiment, although the operation time of each output component may change with time during its lengthy use which results in a change in the measured operation time of each operation block, the assembling apparatus 1 can be prevented from being erroneously diagnosed as abnormal. In general, if the reference operation time is fixedly set, a trial operation should be repeated many times (for example, about 1000 times) in order to maintain the accuracy of the set value. According to the present embodiment, however, a reference value is arranged to be updated every cycle with exclusion of abnormal values, and accordingly, the more the cycle is repeated, the more the accuracy of the reference value is improved. Therefore, the number of trial operations can be reduced considerably in order to set an initial value of the reference value.

Figure 9:
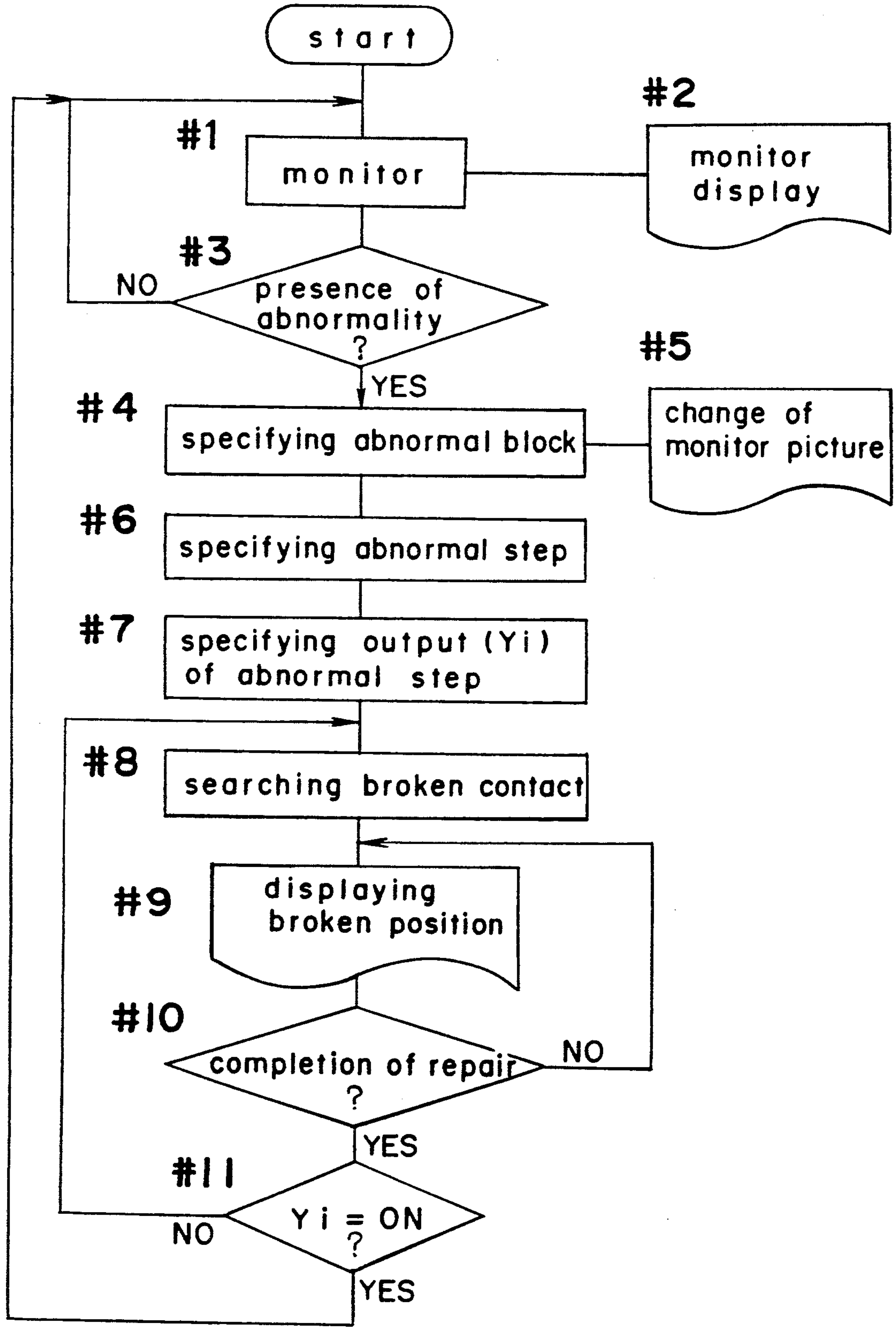
FIG. 9 is a flow-chart for explaining the operation of a breakdown diagnosing device according to the first embodiment.

A breakdown in the assembling apparatus 1 is diagnosed in the following manner with the use of the above diagnosing device, which will be described below with reference to a flow-chart of FIG. 9.

Prior to the start of the system, each contact point and device on the ladder diagram are assigned to a monitor memory of a microcomputer built in the diagnosing device. The output coil Yi corresponding to the internal coil Mi of the interlocking section in each operation step is registered in the memory. The step counter and output coil are indicated in a collation map.

In step #1 after the system is started, the cycle time of the apparatus 1 and operation time of each operation block are monitored. At the same time, in step #2, the whole operating system of apparatus 1 is indicated on the monitor screen of the display unit 8 (referring to FIG. 6). In step #3, it is diagnosed whether or not an abnormality is found in the whole of the operating system. Without any abnormality found (in the case of NO), the monitoring in step #1 is continued. The diagnosis in step #3 provides an abnormal results only when the measured cycle time of the apparatus 1 is over the reference cycle time by a predetermined value ($+3\sigma$). In other cases than the above-mentioned case, even when the operation time in each block is found abnormal, the apparatus 1 is not diagnosed as abnormal, with no generation of an alarm.

In the case of YES in the diagnosis of step #3, the diagnosis is done for every block to thereby specify the abnormal block. In the present embodiment, the abnormal block can be specified by searching out a block which does not finish operating although the measured cycle time exceeds the reference cycle time by the predetermined value or more, namely, which has the register number of the operation step other than 0 (preparing state) or 999 (completed state). Concurrently with step #4, the monitor screen of the display unit 8 is switched to a screen divided into four sections (referring to FIG. 7) in step #5.

Then, in step #6, each operation step in the abnormal block is diagnosed so as to specify the abnormal operation step. In the present embodiment, the abnormal operation step can be easily specified by the value of step number in the abnormal block indicated at that time by the step counter Cs. The abnormal operation step as well as the abnormal block is emphasized by a predetermined color on the monitor screen divided into four sections or assigned on a four-page screen. Thereafter, in step #7, the output coil Yi corresponding to the abnormal operation step is specified on the ladder diagram.

After the output coil Yi is specified in the above manner, a broken contact is searched in step #8. The search is carried out in such a manner that contacts on the ladder diagram are sequentially checked one by one corresponding to the abnormal operation step. However, it is more preferable that the position of each contact on the ladder diagram is designated by an address with a predetermined symbol, and assigned on the memory of the microcomputer incorporated in the diagnosing device, to thereby form an address map of contact points. Accordingly, the broken contact can be automatically searched if the address map is traced.

The searched broken position is emphatically indicated by a predetermined color on the monitor screen (step #9). Therefore, the operator can restore the broken position. At the same time, in step #10, it is confirmed whether or not the repair is completed. If the repair is not completed, the repairing operation is continued. If the repair is completed, it is determined in step #11 whether or not the output coil Yi of the abnormal operation step is turned ON. If the result of step #11 is NO, it means that the broken position is not yet restored. Therefore, each step after step #8 is repeatedly conducted. If the result of step #11 is YES, then, the flow is returned to step #1, reopening the general monitor.

As is described hereinabove, according to the present embodiment, the operation of the assembling apparatus 1 is diagnosed as a whole by means of the cycle time. Therefore, an abnormality of the individual operation block or operation step which does not influence the entire operation of the apparatus can be prevented from being erroneously diagnosed as abnormal.

Moreover, the abnormal block when the apparatus 1 is found abnormal is easily detected by the step counter provided for each block, and further the abnormal operation step can be speedily and correctly detected.

In the foregoing embodiment (hereinafter, referred to as a first embodiment), the description is directed to the assembling apparatus 1 for installing basic components such as suspensions and the like and an engine in the body of an automobile. However, the present invention is not restricted to the assembling apparatus 1, but is applicable to other devices or equipments and further for diagnosing breakdowns of the whole production line.

A second embodiment will be described hereinbelow, in which the diagnosing method is applied to diagnose the whole production line of an automobile assembling factory and to specify the breakdown position.

Figure 15:
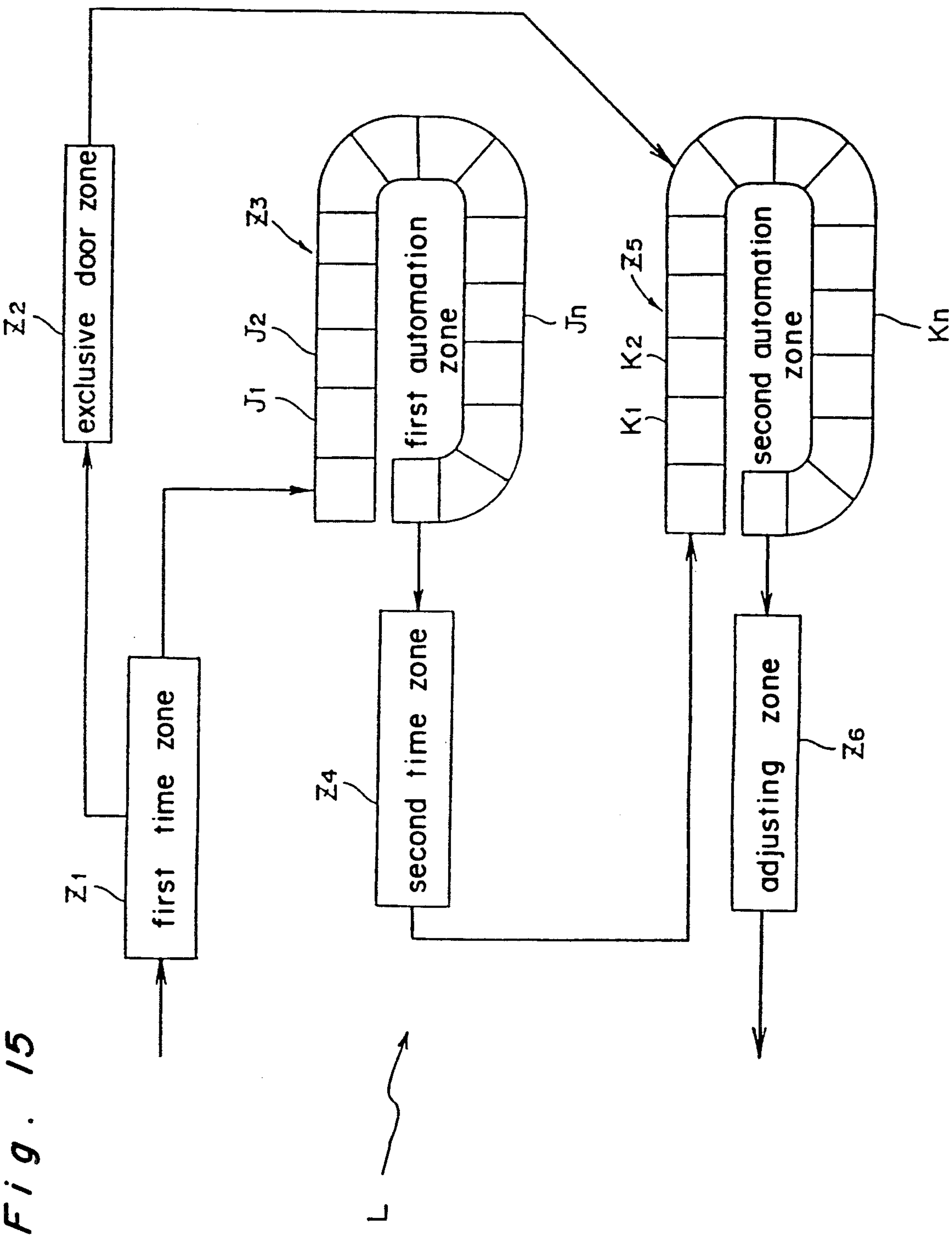
FIG. 15 is a diagram schematically showing the total structure of an automobile assembling line according to a second embodiment of the present invention.

With reference to FIG. 15, an assembling line L of automobiles according to the second embodiment is divided into 6 zones, namely, first and second trim zones Z1, Z4, a first and a second automation zones Z3, Z5, an exclusive door zone Z2 and an adjusting zone Z6. Many automatic assembling devices are arranged in a loop in the automation zones Z3 and Z5. Almost all of the operations are automatically conducted in the automation zones Z3 and Z5. On the other hand, manual assembling is mainly carried out in the remaining four zones.

In the first trim zone Z1, an external wiring harness, an antenna feeder wire, a top sealing, a brake pedal and a reserve tank are mounted in the body of an automobile supplied into the assembling line L after the painting process, which should be done before the automatic assembling in the first automation zone Z1. Although the automobile is carried in the trim zone Z1 with the door attached, the door is once detached from the body in the first trim zone Z1, and the detached door is sent to the exclusive door zone Z2. The exclusive door zone Z2 works only to equip the door.

Then, the body after passing the first trim zone Z1 is sent to the first automation zone Z3 in which various automatic assembling devices J1, J2, . . . , Jn . . . are arranged in a predetermined order of assembling operations. In the first automation zone Z3, functional components such as an engine, a transmission, etc., carrier components such as a suspension and the like, and a base floor are automatically installed in the body. By the way, the assembling apparatus 1 of the first embodiment is placed in this first automation zone Z3.

After the first automation zone Z3, the body is sent to the second trim zone Z4 wherein an instrumental panel, a speaker and an ash tray are installed. The assembling operations in the second trim zone Z4 should be done before the automatic assembling in the second automation zone Z5.

The body sent in the second automation zone Z5 is automatically fitted with tires, front/rear window glasses and sheets by various kinds of automatic mounting devices K1, K2, . . . Kn . . . arranged in a predetermined order of operations. Further, the completed door is mounted in the body in the second automation zone Z5.

Then, when the automobile is sent to the adjusting zone Z6, the step difference between the body and door when the door is closed is adjusted. After the adjustment, the automobile is sent to a tester line in a succeeding process (not shown).

In the assembling line L in the above-described structure, a breakdown diagnosing unit is provided for every class in the total assembling line L, in zones and in mounting devices within the zones. Therefore, when an accident takes place in the total assembling line L a diagnosis is carried out in the order of zones, mounting devices, operation blocks in the operating system and operation steps in the block.

Figure 16:
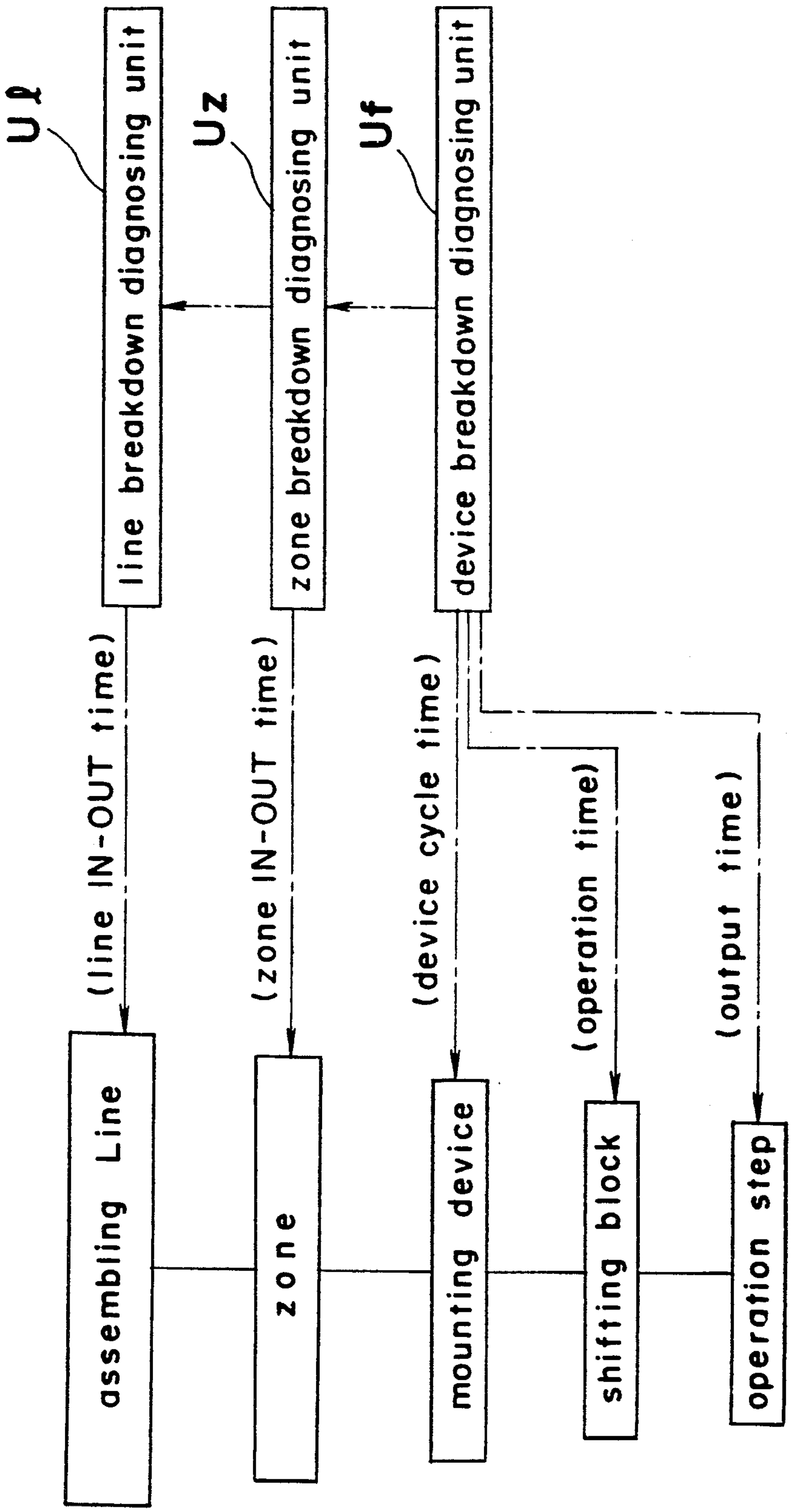
FIG. 16 is a block diagram showing the construction of classes of the automobile assembling line and breakdown diagnosing units according to the second embodiment.

FIG. 16 is a block diagram showing the structure of classes in the assembling line L and a breakdown diagnosing unit for each class. As is clear from FIG. 16, the assembling line L has a line breakdown diagnosing unit Ul for diagnosing a breakdown in the total line L, zone breakdown diagnosing units Uz, . . . , Uz respectively provided for each zone Z1–Z6 for diagnosing each zone, and device breakdown diagnosing units Uf, . . . , Uf provided respectively for each automatic mounting device J1, J2, . . . , Jn, . . . in the first automation zone Z3 and for each automatic mounting device K1, K2, . . . , Kn, . . . in the second automation zone Z5 for diagnosing the each device. The breakdown diagnosing device according to the first embodiment corresponds to the above-mentioned device breakdown diagnosing unit Uf.

In the line breakdown diagnosing unit Ul, the time duration (line IN-OUT time) from the time the to-be-assembled body is sent into the first trim zone Z1 (IN) to the time it is sent out from the adjusting zone Z6 (OUT) is measured. By comparing the measured time with a reference time, the assembling line L is diagnosed as a whole.

In the zone breakdown diagnosing unit Uz, the time duration (zone IN-OUT time) from the time the body is sent into the subject zone (IN) to the time it is sent out to a zone of a succeeding process (OUT) is measured, and compared with a reference time. Accordingly, the zone is diagnosed as a whole. The result of diagnosis by the zone breakdown diagnosing device Uz is inputted to the line breakdown diagnosing device Ul. When the line L as a whole is determined to be abnormal, the broken zone can be specified. On the other hand, when the line IN-OUT time is within the reference range, even when the zone IN-OUT time of each zone is over the reference range, the line L as whole is not decided to be abnormal, and no alarm is generated for the line L.

Moreover, in the device diagnosing unit Uf, the cycle time of the subject device is measured and compared with a reference cycle time, whereby the presence or absence of the breakdown in the device is diagnosed. The diagnosing result by the device breakdown diagnosing unit Uf is inputted to the zone diagnosing unit Uz belonging to the subject device. Therefore, when the zone is found abnormal, it can be specified which device is broken down. In this case as well, if the zone is not abnormal as a whole, no alarm is generated for the zone even when individual devices are found abnormal.

Furthermore, the device breakdown diagnosing unit Uf measures, as is fully described in the first embodiment, the operation time in each block of the operating system of the device and the output time of operation steps in each block. When an abnormality is observed in the device, the measured operation time and output time are respectively compared with the reference operation time and reference output time, so that the abnormal block and operation step can be specified. Thus, which point or position is broken down in the device can be strictly identified.

As is explained in the foregoing description, according to the second embodiment of the present invention, the line breakdown diagnosing unit Ul diagnoses the presence or absence of a breakdown in the total line L, and at the same time, when a breakdown is observed, the broken zone can be specified, and then the broken device can be specified by the zone breakdown diagnosing unit Uz. Moreover, the device breakdown diagnosing unit Uf can specify the broken position of the device. Further, since the presence or absence of breakdown in each class is diagnosed only by the respective IN-OUT time, even an abnormality resulting from an inadvertent manipulation of the operator, in addition to a breakdown in the actuator, device, etc. can be detected.

In the first embodiment, operation steps to be carried out by main output components constituting the operating system of the assembling apparatus 1 (positioning device Q1, transfer device Q2, docking device Q3, slide device Q4, pallet transfer device Q5 and screwing robot Q6) are divided into operation blocks. Therefore, in the event a series of operations are carried out in cooperation with a plurality of the output components, the operation steps of every output component are combined with each other, i.e., the operation steps are so divided as to overlap for each output component (with reference to D, E and F blocks). It may be possible to divide the blocks such that each block is constituted by a group of operation steps for one input component.

As is well known, it generally requires a great deal of work to form a computer program such as a sequential controlling program used in the sequential controlling system. Although an automatic device for forming the computer program has been proposed conventionally, data input and like work relics heavily on manual operation in such a device, and accordingly a reduction in the number of program forming processes is not sufficiently achieved.

In the meantime, an improved automatic program forming device is disclosed in a third embodiment of the present invention, whereby the program forming processes can be effectively reduced in number. The third embodiment is applied to a production line divided into blocks in a different manner from the first embodiment, which will be described hereinbelow.

Figure 17:
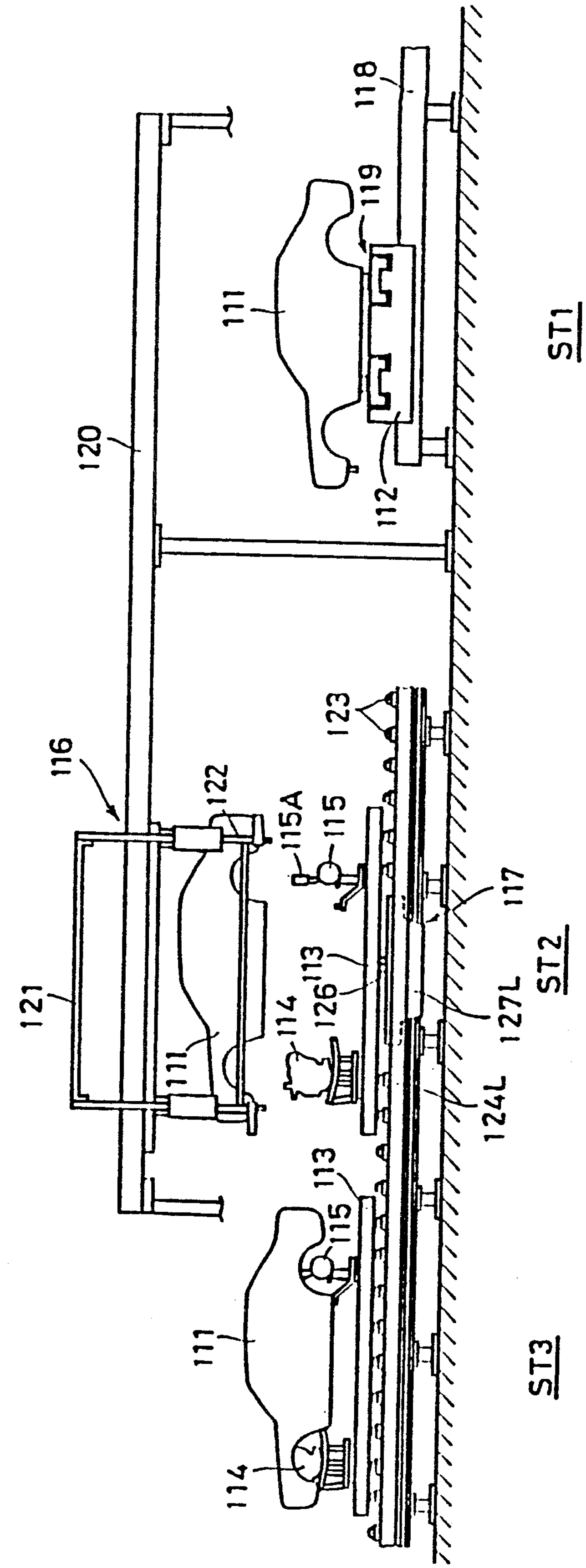
FIGS. 17 and 18 are views schematically showing the structure of one example of a motor vehicle assembling line installed with an equipment which is sequentially controlled in accordance with a sequential controlling program formed by an automatic program forming apparatus according to a third embodiment of the present invention.
Figure 18:
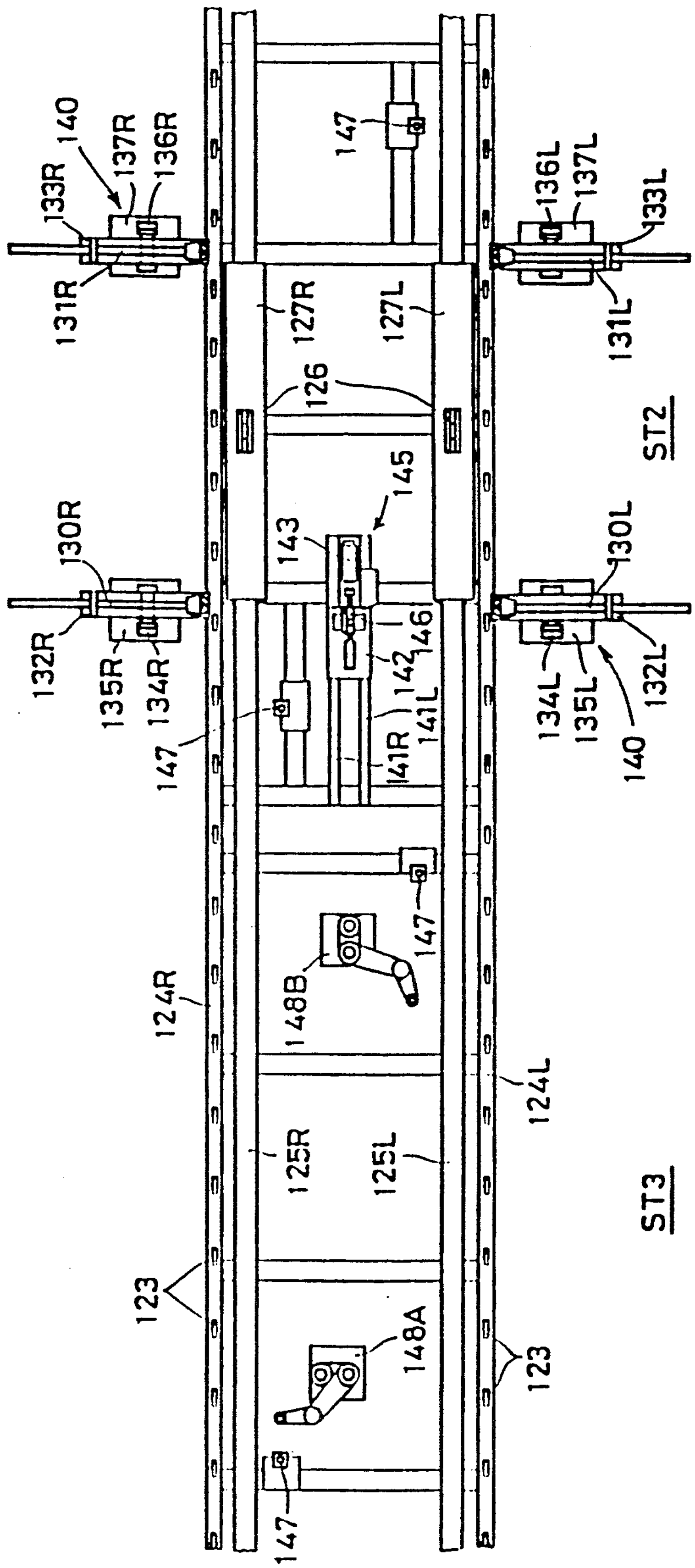

According to the third embodiment shown in FIGS. 17 and 18, a motor vehicle assembling line is provided with a positioning station ST1, a docking station ST2 and a screwing station ST3. In the positioning station ST1, a body 111 of the motor vehicle is received on a receiving stand 112 which is controlled to position the body 111. In the docking station ST2, the body 111 is docked with an engine 114, a front suspension assembly (not shown) and a rear suspension assembly 115 placed at respective predetermined positions on a pallet 113. The docked body 111, engine 114, front suspension assembly (not shown) and rear suspension assembly 115 are fixedly tightened up by screws in the screwing station ST3. A transfer device 116 is placed overhead between the positioning and docking stations ST1 and ST2 so as to hold and transfer the body 111. Moreover, the production line further includes a pallet transfer device 117 between the docking and screwing stations ST2 and ST3 for transferring the pallet 113.

The receiving stand 112 in the positioning station ST1 is adapted to move reciprocally along a rail 118. Although abbreviated in the drawings, the positioning station ST1 also has a positioning means (BF) for positioning the front part of body 111 on the receiving stand 112 in a widthwise direction, a positioning means (BR) for positioning the rear part of body 111 in the widthwise direction, and a positioning means (TL) for positioning the body in a lengthwise direction. In order to position the body, respective positioning means move the receiving stand 112 in a direction orthogonal to the rail 118 (widthwise direction of the body) and along the rail 118 (lengthwise direction). Furthermore, lifting reference pins (FL, FR, RL and RR) are also provided to be engaged with front right and left portions, and the rear right and left portions of the body to thereby position the body 111 for the receiving stand 112. The above-mentioned positioning means and lifting reference pins constitute a positioning device 119 in the positioning station ST1.

The transfer device 116 is comprised of a guide rail 120 stretching above between the positioning and docking stations ST1 and ST2, and a carrier 121 adapted to move along the guide rail 120. A lifting hanger arm 122 provided with the carrier 121 supports the body 111. On the other hand, the pallet transfer device 117 is provided with a pair of guide portions 124L and 124R which have many support rollers 123 for receiving the lower surface of the pallet 113, a pair of transfer rails 125L and 125R respectively parallel to guide portions 124L and 124R, and pallet engaging portions 126 for engaging the pallet 113. Pallet carrier platforms 127L and 127R are driven by a linear motor mechanism along the transfer rails 125L and 125R, respectively.

There are provided a pair of front left and right clamp arms 130L and 130R, and a pair of rear left and right clamp arms 131L and 131R in the docking station ST2. By these clamp arms, a strut of the front suspension assembly and a strut 115A of a rear suspension assembly 115 are supported in an assembling posture. The front left and right clamp arms 130L and 130R are so mounted in mounting plates 132L and 132R as to be retractable in an orthogonal direction to the transfer rails 125L and 125R, respectively. Similarly, the rear clamp arms 131L and 131R are so mounted in mounting plates 133L and 133R as to be retractable in an orthogonal direction to transfer rails 125L and 125R, respectively. Moreover, clamp arms 130L and 130R and, 131L and 131R are formed at respective front ends confronting each other with engaging portions to be engaged with the strut of the front suspension assembly and, strut 115A of the rear suspension assembly 115. The mounting plate 132L is made movable for a fixed platform 135L by an arm slide 134L in a direction along the transfer rails 125L and 125R. The mounting plate 132R is also made movable for a fixed platform 135R by an arm slide 134R in a direction along the transfer rails 125L and 125R. Likewise, the mounting plate 133L is movable for a fixed platform 137L by an arm slide 136L in a direction along the transfer rails 125L and 125R, and the mounting plate 133R is movable for a fixed platform 137R by an arm slide 136R in a direction along the transfer rails 125L and 125R. Therefore, the front left and right clamp arms 130L and 130R are movable in a front-and-rear direction and in a left-and-right direction while the front ends thereof are engaged with the strut of the front suspension assembly. At the same time, the rear left and right clamp arms 13aL and 13aR are movable in a front-and-rear direction and in a left-and-right direction while the front end portions thereof are engaged with the strut 115A of the rear suspension assembly 115. The front left and right clamp arms 130L and 130R, arm slides 134L and 134R, rear left and right clamp arms 131L and 131R and arm slides 136L and 136R form a docking device 140.

In the docking station ST2, a slide device 145 is comprised of a pair of slide rails 141L and 141R adapted to extend parallel to the transfer rails 125L and 125R respectively, a movable member 142 sliding along the slide rails 141L and 141R and a motor 143 for driving the movable member 142, etc. The movable member 142 of the slide device 145 has an engaging means 142 which is engaged with a movable engine support member (not shown) provided on the pallet 113 which is positioned by two lifting pallet reference pin 147. When the body 111 supported by the lifting hanger arm 122 of the transfer device 116 is assembled with the engine 114 on the pallet 113 and front and rear suspension assemblies 115, the slide device 145 is moved front and rear while it is engaged with the movable engine support member with its engaging means 146 positioned by the lifting pallet reference pin 147 on the pallet 113. Consequently, the engine 114 is moved front and rear for the body 111, thereby avoiding an interference therebetween.

In the screwing station ST3, robots 148A and 148B are installed respectively so as to tighten the engine 114 and front suspension assembly with the body 111, and to tighten the rear suspension assembly 115 with the body 111. A plurality of lifting pallet reference pins 147 are also provided in this screwing station ST3 to position the pallet 113 at a predetermined position.

In the motor vehicle assembling line in the above-described construction, operations related to the positioning device 119 and transfer device 116 of the positioning station ST1, docking device 140, slide device 145 and pallet transfer device 117 of the docking station ST2 and, robots 148A and 148B of the screwing station ST3 are arranged to be sequentially controlled on the basis of a sequential program by a sequential control unit connected thereto.

The operations executed by the above-mentioned equipment, namely, the motor vehicle assembling line under the sequential control are divided into 12 operation blocks, B0–B11, as a unit of a series of operations independently practicable from the start to finish thereof. A full detail of the operation blocks will be given hereinbelow.

B0: the receiving stand 112 and body 111 thereon are positioned by the positioning device 119 (receiving stand positioning operation block).

B1: the body 111 is turned ready to be transferred by the transfer device 116 (transfer device preparing operation block).

B2: it is prepared by the docking device 140 for the strut of the front suspension assembly to be clamped by front left and right clamp arms 130L and 130R, and for the strut 115A to be clamped by the rear left and right clamp arms 131L and 131R (strut clamping preparing operation block).

B3: the body 111 on the receiving stand 112 positioned by the positioning device 119 is transferred to the lifting hanger arm 122 of the transfer device 116, which becomes ready to be carried out (transfer device receiving operation block).

B4: the engaging means 146 provided in the movable member 142 is brought to be engaged with the engine support member on the pallet 113 by the slide device 145 (slide device preparing operation block).

B5: the receiving stand 112 is returned to its original position by the positioning device 119 (receiving stand returning operation block).

B6: the body 111 supported by the lifting hanger arm 122 of the transfer device 116 is assembled with the engine 114 arranged on the pallet 113, strut of the front suspension assembly arranged on the pallet 113 and clamped by the front left and right clamp arms 130L and 130R, and the strut 115A of the rear suspension assembly 115 clamped by the rear left and right clamp arms 131L and 131R (engine/suspension docking operation block).

B7: the transfer device 116 returns to its original position (transfer device returning operation block).

B8: front left and right clamp arms 130L and 130R, and rear left and right clamp arms 131L and 131R are returned to respective original positions by the docking device 140 (clamp arm returning operation block).

B9: the linear motor is driven by the pallet transfer device 117, so that the pallet 113 having the assembled body 111 thereon with the engine 114, front suspension assembly and rear suspension assembly 115 is transferred to the screwing station ST3 (linear motor driving block).

B10: the engine 114 and front suspension assembly assembled with the body 111 are tightly screwed by the robot 148A (screwing <1> operation block).

B11: the rear suspension assembly 115 assembled with the body 111 is tightly screwed by the robot 148B (screwing <2> operation block).

Each operation block B0–B11 is divided into a plurality of operation steps accompanying outputs. By way of example, for the receiving stand positioning operation block B0, ten operation steps B0S0–B0S9 are defined as follows.

B0S0: the receiving stand 112 is moved such that the front portion of the body 111 is positioned in the widthwise direction thereof by the positioning means BF (BF positioning operation step).

B0S1: the receiving stand 112 is moved such that the rear portion of the body 111 is positioned in the widthwise direction thereof by the positioning means BR (BR positioning operation step).

B0S2: the receiving stand 112 is moved such that the body 111 is positioned in a direction along the rail 118 (lengthwise direction) by the positioning means TL (TL positioning operation step).

B0S3: the lifting reference pin FL is engaged with the front left portion of the body 111 (FL engaging operation step).

B0S5: the lifting reference pin FR is engaged with the front right portion of the body 111 (FR engaging operation step).

B0S6: the lifting reference pin RL is engaged with the rear left portion of the body 111 (RL engaging operation step).

B0S7: the lifting reference pin RR is engaged with the rear right portion of the body 111 (RR engaging operation step).

B0S8: the positioning means BF returns to its original position from where it positions the front portion of the body 111 in the widthwise direction (BF returning operation step).

B0S9: the positioning means BR returns to its original position from where it positions the rear portion of the body 111 in the widthwise direction (BR returning operation step).

As mentioned earlier, the above operations of the equipment in the assembling line are sequentially controlled in accordance with the sequential control program which is formed by the automatic program forming device according to the present embodiment. The automatic program forming device will be explained hereinbelow.

Figure 19:
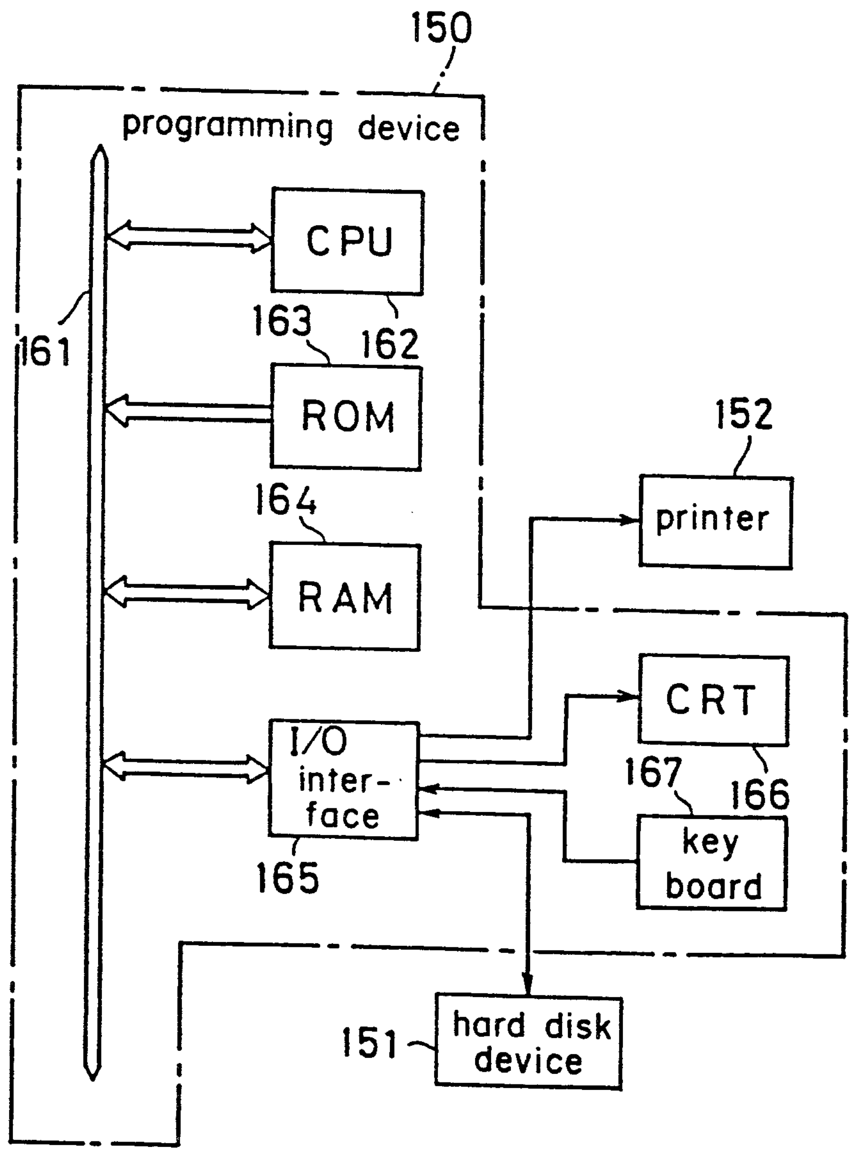
FIG. 19 is a view schematically showing the structure of one example of the automatic program forming apparatus according to the third embodiment.

FIG. 19 is one example of the automatic program forming device according to the present embodiment. The automatic program forming device is provided with a programming unit 150, a hard disc unit 151 as an external memory and a printer 152 both connected to the unit 150. The programming unit 150 is incorporated with a central processing unit (CPU) 162, a read only memory (ROM) 163, a random access memory (RAM) 164 and an input/output interface (I/O interface) 165 which are connected to each other through a bus line 161. Moreover, the programming unit 150 is fitted with a display cathode ray tube (CRT) 166 and a keyboard 167 both connected to the I/O interface 165. Data and control codes are inputted through the keyboard 167. The hard disc unit 151 is connected with the printer 152 through the I/O interface 165.

In forming the sequential control program by the above-described device, the operation blocks B0–B11 are tabulated in an operation block map as shown in Table-1 below. In the operation block map of Table-1, reference "SC-REG" represents a register of 16 bits provided for each operation block B0–B11 in which register the step number is written every time the subject operation step is carried out. Reference "FROM" of the table represents an operation block immediately before the subject operation block is started, while "TO" represents an operation block immediately after the subject operation block, which is started upon completion of the subject operation block. Reference "clear condition" designates an operation block when the equipment related to the subject operation block is returned to the initial state. Moreover, reference "equipment" indicates an objective device for sequential control related to the subject operation block. The contents of "No." and "SC-REG" are automatically formed, and the contents of "block name", "FROM", "TO", "clear condition" and "equipment" are inputted through the keyboard 167.

TABLE 1

| No. | SC-REG | Block name | FROM | TO | Clear condition | Equipment |
|---|---|---|---|---|---|---|
| B0 | D 1000 | Receiving stand positioning | Body present on stand | B3 | B5 | 119 receiving |
| B1 | D 1001 | Transfer device preparing | Body present on stand | B3 | B7 | 116 receiving |
| B2 | D 1002 | Strut clamping preparing | Body present in ST2 | B4 | B8 | 140 |
| B3 | D 1003 | Transfer device receiving | B0, B1 | B5 B6 | B7 | 119 116 |
| B4 | D 1004 | Slide device preparing | B2 | B6 | B7 B8 | 145 |
| B5 | D 1005 | Receiving stand returning | B3 | — | B5 | 119 |
| B6 | D 1006 | Engine/suspension docking | B3, B4 | B7 B8 | B7 B8 | 116 140 145 |
| B7 | D 1007 | Transfer device returning | B6 | — | B7 | 116 |
| B8 | D 1008 | Clamp arm returning | B6 | — | B8 | 140 |
| B9 | D 1009 | Linear motor driving | Body present in ST2 | — | B9 | 117 |
| B10 | D 1010 | Screwing <1> | Body present in ST3 | — | B10 | 148A |
| B11 | D 1011 | Screwing <2> | Body present in ST3 | — | B11 | 148B |

A plurality of operation steps in each operation block B0–B11 are also tabulated in an operation step map. For example, operation steps B0S0–B0S9 of the operation block B0 are tabulated in an input/output map for the positioning device 119 as shown in Table-2. In Table-2, reference "comment" means contents in each operation step. "No." is automatically formed, and "comment", "operation" and "original position" are inputted through the keyboard 167, and further "output coil device", "confirmation input contact device" and "manual input contact device" are automatically set.

Subsequently, when "comment, in Table-2 is called up, an operation step map shown in Table-3 is formed. The operation steps in each operation block B1–B11 are similarly tabulated in the operation step map.

Figure 20A:
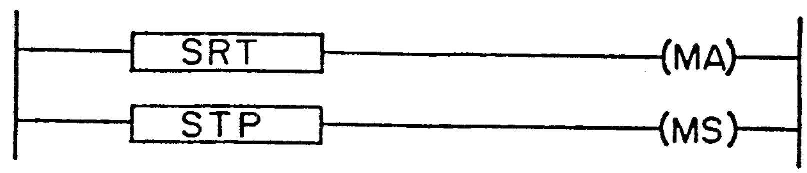
FIG. 20 is a view for explaining the formation of sequential controlling program formed by the automatic program forming apparatus according to the third embodiment.
Figure 20B:
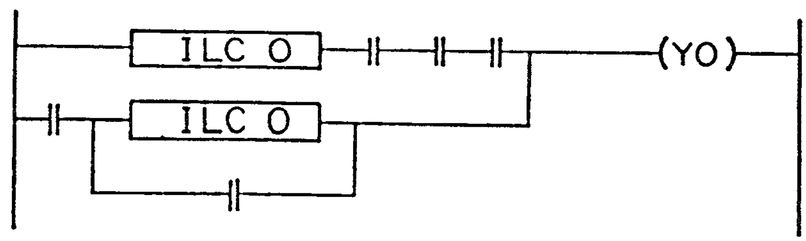
Figure 20C:
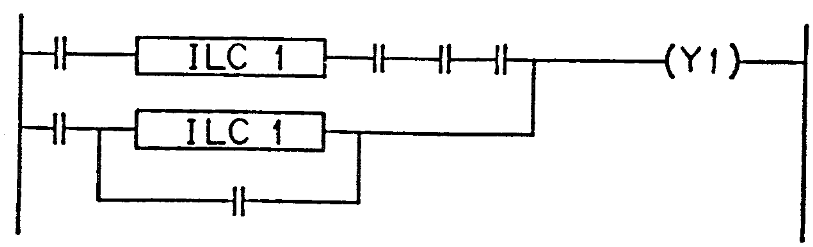

Based on the above-tabulated operation step map for each operation block, plural kinds of fixed step ladder patterns corresponding to each operation step are prepared, for example, as indicated by FIGS. 20A, 20B and 20C, which are then stored in the hard disc unit 151, whereby a data base of fixed step ladder patterns is formed.

TABLE 2

| 119 Positioning device | | | Bo, Output coil device | B3, Confirmation input contact device | B5 Manual input contact | Original position device |
|---|---|---|---|---|---|---|
| | Comment | Operation | | | | |
| A01 | Work present | — | — | X0 | X1 | — |
| A02 | BF (Positioning) | Out | Y1 | X1 | XB | |
| A03 | BF (Positioning) | Return | Y2 | X2 | XC | ○ |
| A04 | BR (Positioning) | Out | Y3 | X3 | XD | |
| A05 | BR (Positioning) | Return | Y4 | X4 | XE | ○ |
| A06 | TL (Positioning) | Out | Y5 | X5 | XF | |
| A07 | TL (Positioning) | Return | Y6 | X6 | X10 | ○ |
| A08 | FR reference pin | Out | Y7 | X7 | X11 | |
| A09 | FR reference pin | Return | Y8 | X8 | X12 | ○ |
| A10 | FL reference pin | Out | Y9 | X9 | X13 | |

TABLE 2-continued

| 119 Positioning device | | | Bo, Output coil device | B3. Confirmation input contact device | B5 Manual input contact | Original position device |
|---|---|---|---|---|---|---|
| | Comment | Operation | | | | |
| A11 | Fl reference pin | Return | YA | XA | X14 | ∘ |
| A12 | RR reference pin | Out | YB | XB | X15 | |
| A13 | RR reference pin | Return | YC | XC | X16 | ∘ |
| A14 | RL reference pin | Out | YD | XD | X17 | |
| A15 | RL reference pin | Return | YE | XE | X18 | ∘ |

TABLE 3

| No. | Comment | Operation | Output coil device | Conf. input contact device | Manual input contact device | Orig. position | Return conf. contact device | Simul. ope. |
|---|---|---|---|---|---|---|---|---|
| B000 | Ope. block preparing | | | | | | | |
| B0S0 | Condition confirm. | — | Y0 | X0 | XA | | | |
| B0S1 | BF (Positioning) | Out | Y1 | X1 | XB | | X8 | |
| B0S2 | BR (Positioning) | Out | Y2 | X2 | XC | | X9 | |
| B0S3 | TL (Positioning) | Out | Y3 | X3 | XD | | | |
| B0S4 | FR reference pin | Out | Y4 | X4 | XE | | | 1 |
| B0S5 | FL reference pin | Out | Y5 | X5 | XF | | | 1 |
| B0S6 | RR reference pin | Out | Y6 | X6 | X10 | | | 1 |
| B0S7 | RL reference pin | Out | Y7 | X7 | X11 | | | 1 |
| B0S8 | BF (Positioning) | Return | Y8 | X8 | X12 | ∘ | | |
| B0S9 | BR (Positioning) | Return | Y9 | X9 | X13 | ∘ | | |
| B999 | Ope. block complete | | | | | | | |

Figure 21:
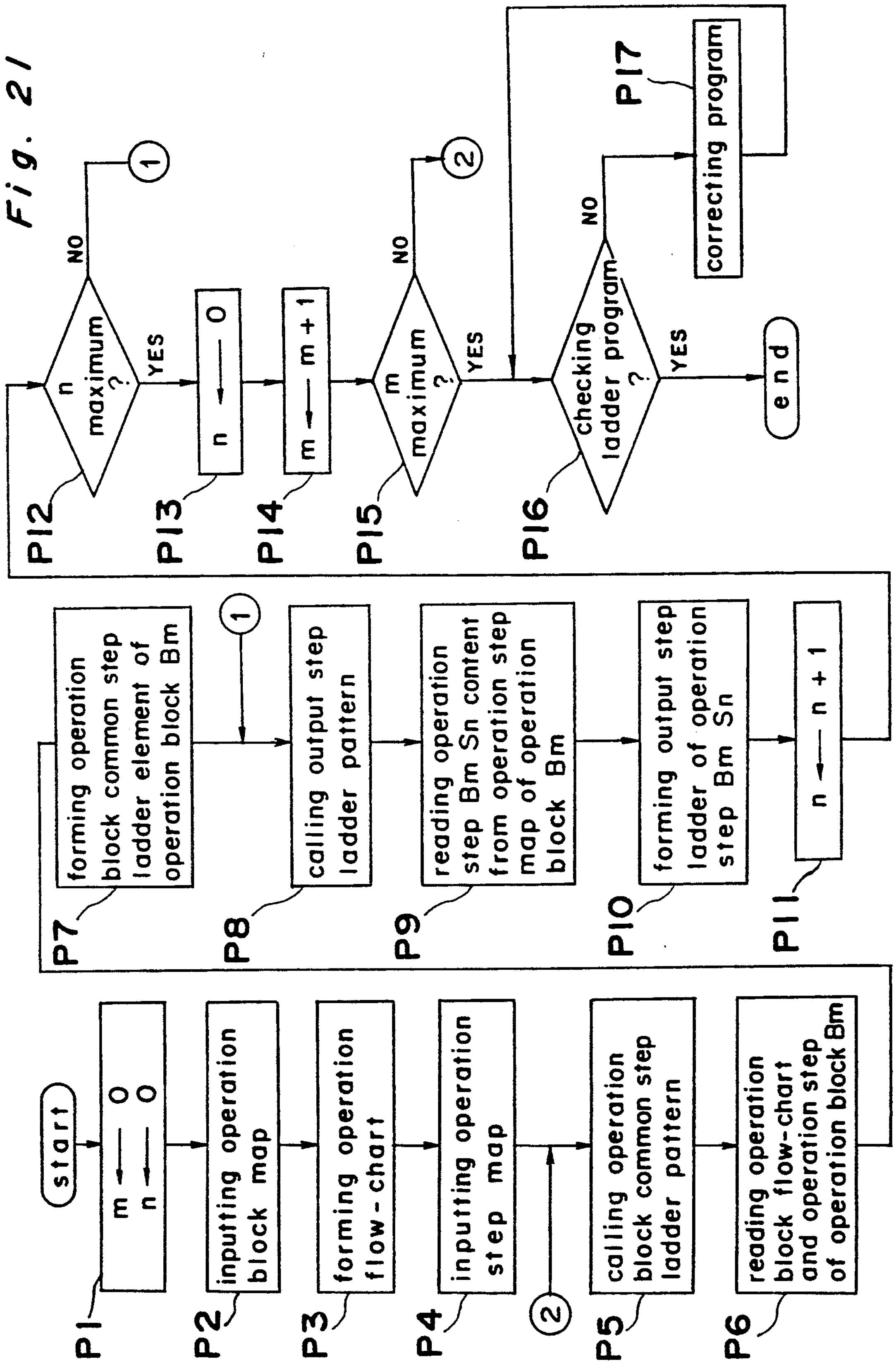
FIG. 21 is flow-chart showing the forming procedure of a sequential controlling program by the automatic program forming apparatus according to the third embodiment.

The sequential control program is formed into the ladder program by the procedure represented by a flow-chart of FIG. 21, which procedure will be described hereinbelow.

Figure 22:
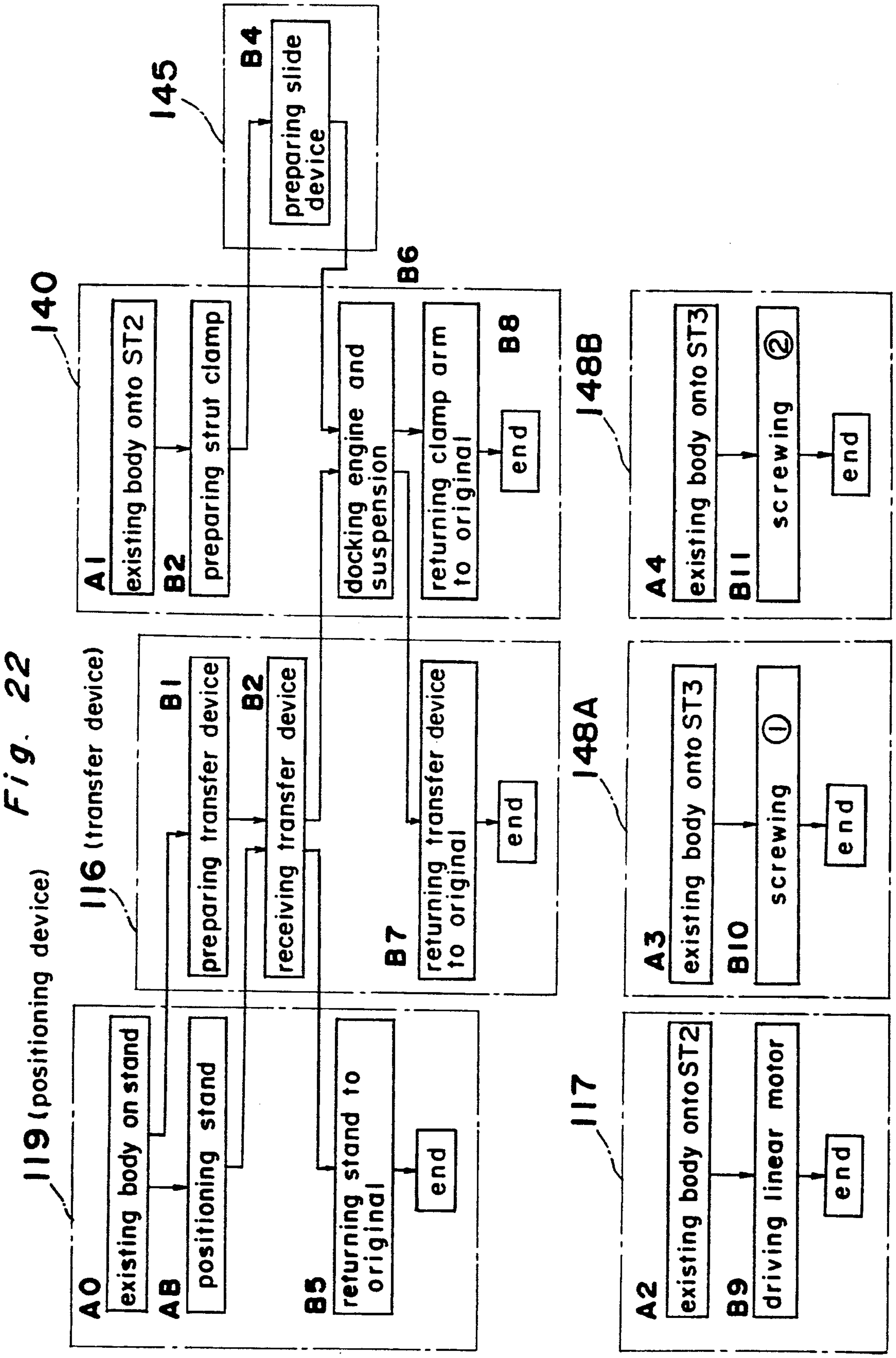
FIG. 22 is a flow-chart of operation blocks for explaining the formation of a sequential controlling program by the automatic program forming apparatus according to the third embodiment.

At the initial setting, first of all, variables m and n are set respectively to be 0 (step P1). Then, data on the operation blocks B0–B11 and attributes thereof indicated in the operation block map in Table-1 are inputted through the keyboard 167, and accordingly the operation block map is indicated on the CRT 166 and stored in RAM 164 (step P2). An operation block flow-chart as indicated in FIG. 22 is formed on the basis of the data of the operation block map stored in RAM 164 in accordance with a converting program read from ROM 163. The operation block flow-chart is stored in RAM 164 (step P3).

Thereafter, data on the operation steps B0S0–B0S9 for the operation block B0 indicated in the map of Table-3 and attributes thereof are inputted through the keyboard 167 so as to form an operation step map of Table-3 on CRT 166. The step map is stored in RAM 164. Subsequently, in a similar manner, data on the operation steps and attributes for each operation block B1–B11 are inputted to form respective operation step maps which are in turn stored in RAM 164. As a result of this, 12 operation step maps in total are stored in RAM 164 for the operation blocks B0–B11 (step P4).

For example, an operation block common step ladder pattern as shown in FIG. 20A among the fixed step ladder patterns is read out from the hard disc unit 151 to CPU 162. While the operation block flow-chart and the operation step map for the operation block B0 are read out from RAM 164, parameters of starting conditions ART for the block B0 and output contact device MA related thereto, and stopping conditions STP and output contact device MS related thereto, etc. are written in the operation block common step ladder pattern. Accordingly, factors of the operation block common step ladder for the block B0 are formed and stored by the register in CPU 162 (steps P5–P7).

Thereafter, from the hard disc unit 151, an output step ladder pattern shown in FIG. 20B is read out to CPU 162 among the fixed step ladder patterns. At the same time, while the contents of the operation step B0S0 are read out by RAM 164 from the operation block flow-chart and the operation step map for the block B0 to CPU 162, parameters for the step B0S0, namely, confirmation contact device X0, manual contact device XA, output contact device Y0, etc. are written in the output step ladder pattern in CPU 162 in accordance with the program from ROM 163. Further, parameters of output contact devices MA and MS, interlocking release contact device XI and the like are added, to thereby automatically form factors of the output step ladder corresponding to the operation step B0S0 and to store the same in the register in CPU 162.

Among the fixed step ladder patterns, for example, an output step ladder pattern indicated in FIG. 20C is read by CPU 162 from the hard disc unit 151. In addition, while contents of the operation step B0S1 are read out from the operation block flow-chart and operation step map for the block B0 by RAM 164, in CPU 162, parameters for the operation step B0S1, i.e., confirmation contact device X1, manual contact device XB, output contact device Y1, etc. are written into the output step ladder pattern. Moreover, parameters of the output contact devices MA and MS, interlocking release contact device XI and confirmation contact device X0, etc. are added, so that factors of the output step ladder for the operation step B0S1 are automatically formed and stored in the register in CPU 162.

Figure 23:
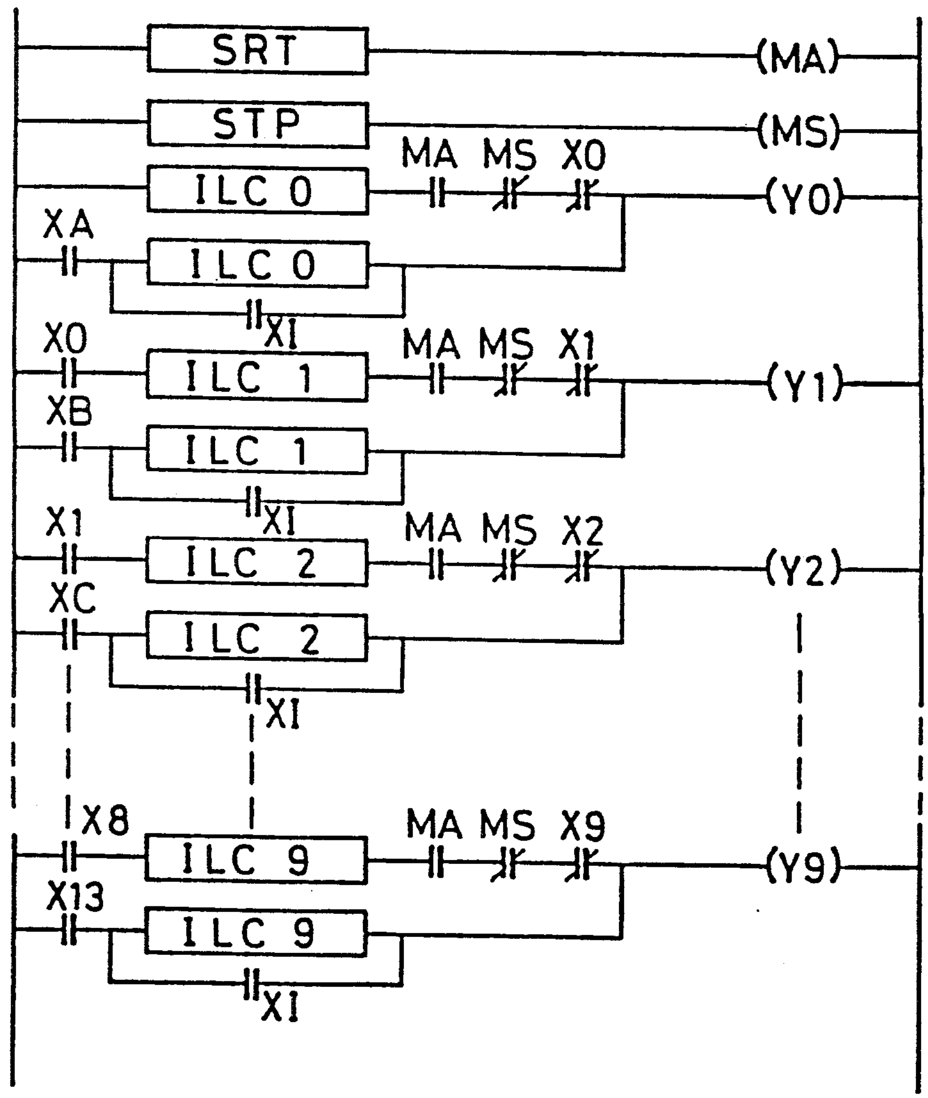
FIG. 23 is a ladder diagram showing an example of a sequential controlling program formed by the automatic program forming apparatus according to the third embodiment.

Then, during every one increment of the variable n, factors of the output step ladder for each operation step B0S2–B0S9 are sequentially automatically formed in the same manner as those for the operation step B0S1, and stored in the register within CPU 162. In consequence, as indicated in FIG. 23, a ladder program for the operation block B0 is formed (step P8–P12). It is to be noted that after the factors of the output step ladder for the operation step B0S9 are formed, the variable n is returned to 0 (step P13).

After formation of the ladder program for the operation block B0, ladder programs for operation blocks B1–B11 are similarly formed one by one in accordance with the flow-chart of FIG. 22 during every one increment of the variable m. Thus, at last, the ladder programs for respective operation blocks B0–B11 are connected to each other to thereby constitute a sequential controlling ladder program for sequentially controlling the objective equipment in the motor vehicle assembling line shown in FIGS. 17 and 18 (steps P14, P15). Then, it is checked whether or not the obtained sequential controlling ladder program is proper from every point of view. In case the program contains an improper point, it is corrected to suit to the equipment (steps P16, P17). The sequential controlling ladder program obtained in the foregoing manner is stored in RAM 164, and upon necessity, e.g., it is printed out by the printer 152.

As is clear from the above description, according to the automatic forming apparatus of the sequential controlling program of the present embodiment, the main parts of the sequential controlling program are automatically formed on the basis of the inputted data on each operation block and attributes thereof, and each operation step of every operation block and attributes thereof, to thereby form step ladder components for each operation step. The step ladder components for each operation step are connected to each other to form a ladder program. Therefore, the number of forming processes for the sequential controlling program can be effective reduced.

Hereinbelow an example of the breakdown diagnosing method of the present invention will be depicted in relation to the case where the method is applied to the above-mentioned motor vehicle assembling line installed with the equipment under sequential control.

Figure 25:
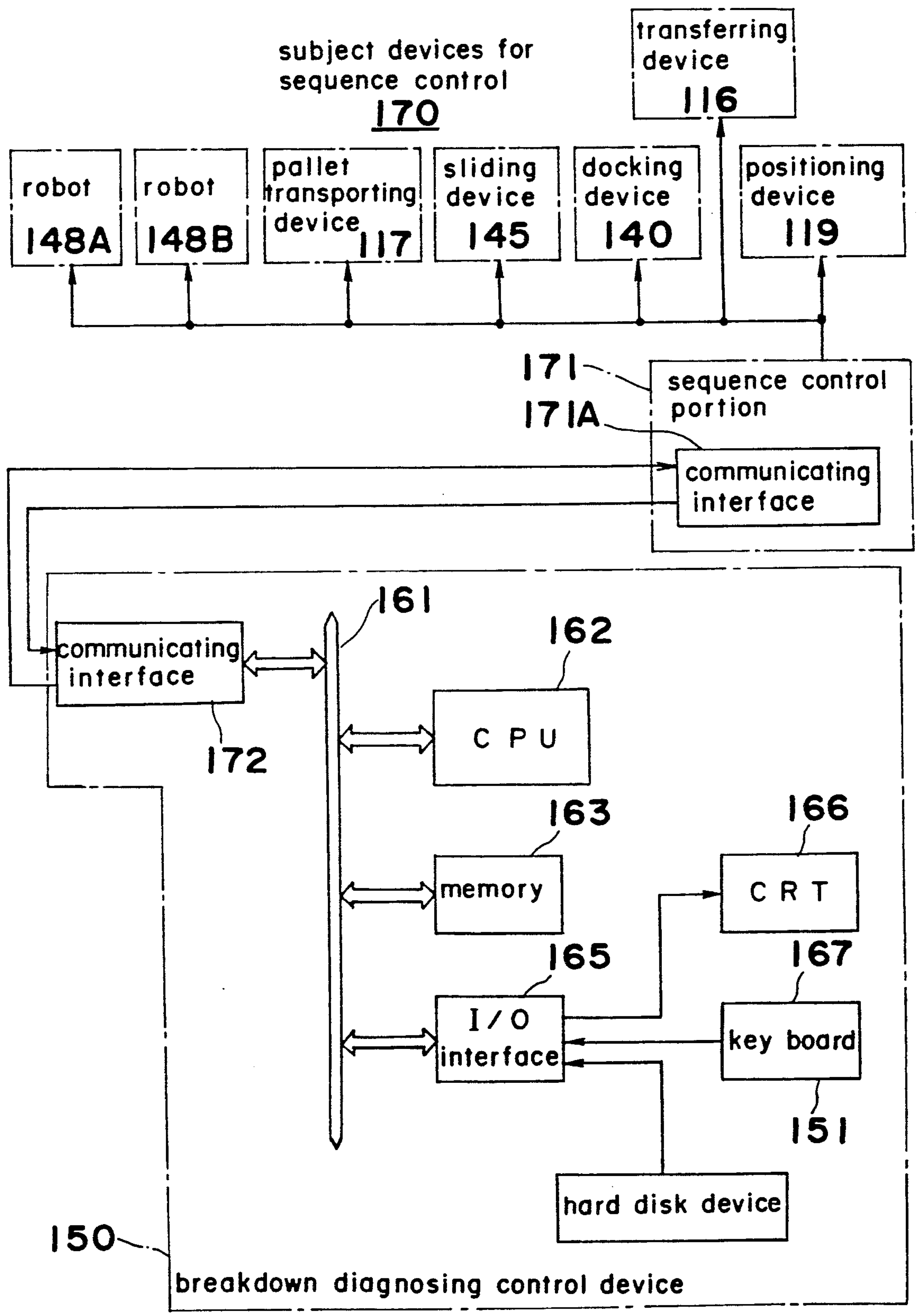
FIG. 25 is a block diagram showing the structure of a breakdown diagnosing system executing the one example of the breakdown diagnosing method together with an equipment to be sequentially controlled and a sequential controlling unit.

FIG. 25 indicates a breakdown diagnosing system executing the one example of the breakdown diagnosing method of the present invention in which an equipment 170 to be sequentially controlled and a sequential controlling unit 171 are also illustrated. As described earlier, the equipment 170 is comprised of a positioning device 119, a transfer device 116, a docking device 140, a slide device 145, a pallet carrier device 117 and robots 148A and 148B, which are sequentially controlled by the sequential controlling unit 171.

Figure 26:
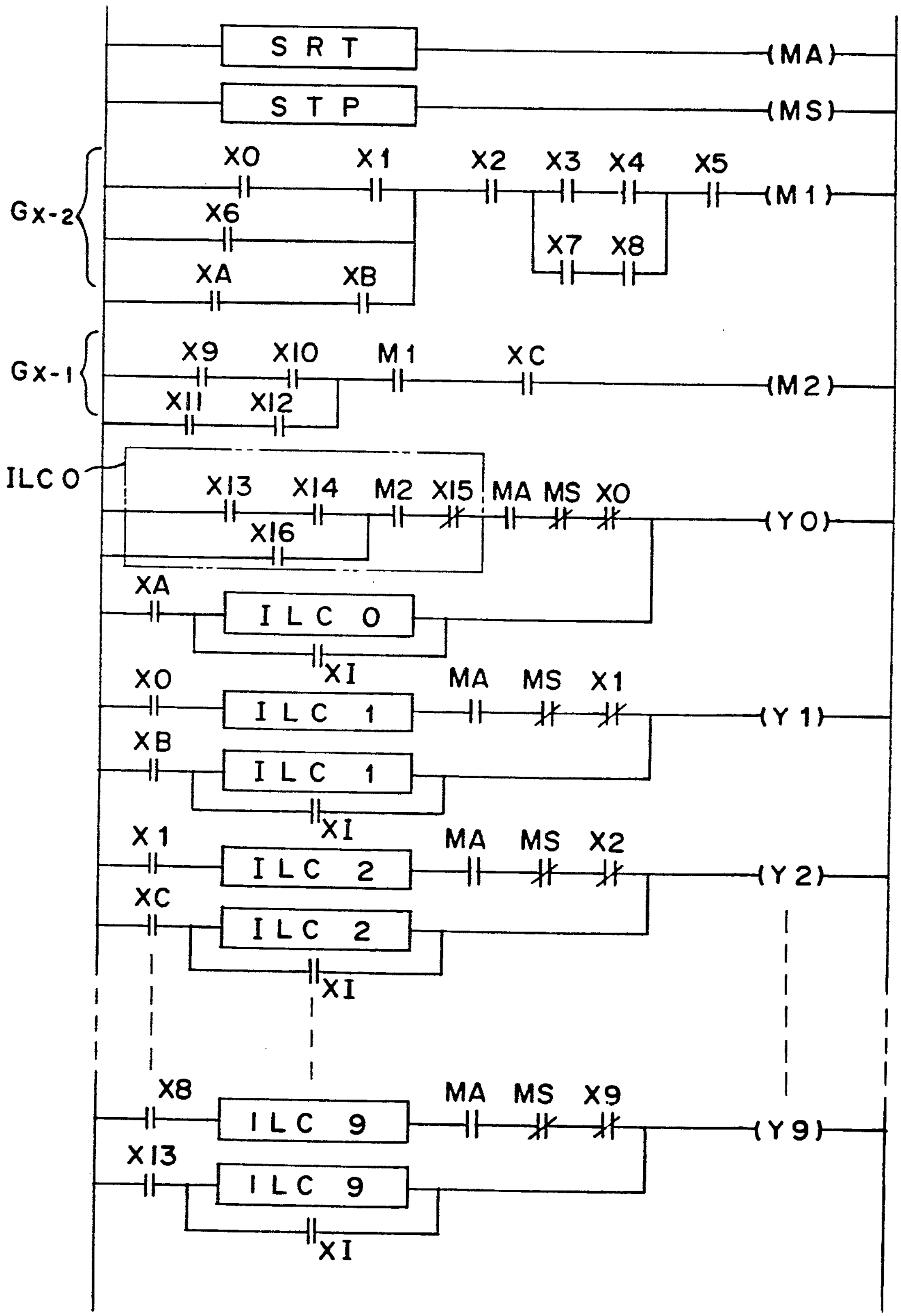
FIG. 26 is a ladder diagram of one example of a sequential control program used in the sequential control of the equipment by the sequential controlling unit.

Operations of the equipment 170 are sequentially controlled on the basis of the sequential control program loaded in the sequential controlling unit 171. The sequential control program is, for example, a sequential control ladder program in such constitution that a ladder program shown in FIG. 26 is formed correspondingly for one operation step in an operation block. In the ladder program of FIG. 26, references (M1), (M2) and (Y0) are output devices, M1 and M2 are contact devices corresponding to the output devices (M1) and (M2), and X0–X16 and XA–XC are contact devices not corresponding to the output devices.

The breakdown diagnosing system includes the controlling unit 150 for breakdown diagnosis. The controlling unit 150 is provided with the central processing unit (CPU) 162, memory unit 163, input/output interface (I/O interface) 165 and a transceiver interface 172 which are connected to each other through the bus line 161. Moreover, the controlling unit is fitted with the hard disc unit 151 as an auxiliary memory, display cathode ray tube (CRT) 166 and, data and control codes inputting keyboard 167, all connected to the I/O interface 165. The transceiver interface 172 is connected to a transceiver interface 171A provided in the sequential controlling unit 171.

In the breakdown diagnosing controlling unit 150, CPU 162 receives, upon manipulation of the keyboard 167, program processing data indicating the progress of the sequential control of the equipment 170 from the controlling unit 171 through the transceiver interfaces 171A and 172, to thereby detect a breakdown in the equipment 170 based on the program processing data from the controlling unit 171 while the memory unit 163 writes and reads the data. When a breakdown is detected, the display CRT 166 makes the related indication. The hard disc unit 151 stores the data of every step ladder element in the sequential control ladder program loaded in the controlling unit 171 in a manner able to be independently read out. Accordingly, the hard disc unit 151 forms a data base of the sequential control ladder program.

The breakdown diagnosing method according to the present invention is carried out in the above-described manner in the breakdown diagnosing controlling unit 150 having the construction shown in FIG. 25. That is, CPU 162 sequentially receives program processing data indicative of the progress of the sequential control for the equipment 170 from the controlling unit 171 via the transceiver interfaces 171A and 172 to detect an occurrence of a breakdown in the equipment based on the receiving data, and at the same time, to search for a component in the equipment 170 causing the breakdown, namely, for a broken component. Moreover, the display CRT 167 is controlled to indicate the display related to the breakdown. The diagnosing process will be described in more detail hereinbelow.

CPU 162 of the controlling unit 150 detects a breakdown in the equipment 170 and searches for the broken component when the breakdown is detected, in accordance with the operation block flow-chart shown in FIG. 22. The diagnosis of breakdown is made independently for each operation block B0–B11 which is sequentially executed in accordance with the flow-chart.

For example, an execution time from the start to finish of a plurality of operation steps constituting each operation block B0–B11 is measured and compared with a preset reference time. When the measured time consumed for actual execution of the operation steps is longer than the reference time, it is determined that any one of the positioning device 119, transfer device 116, docking device 140, slide device 145, pallet carrier device 117 and robots 148A and 148B in the equipment 170 executing the subject operation block is broken. Then, an operation step including the operation of an output means turned OFF by the breakdown is specified as the abnormal operation step in the subject operation block. Thereafter, further, a component of the device executing the specified operation step which causes the output means to be turned OFF is searched.

Figure 24:
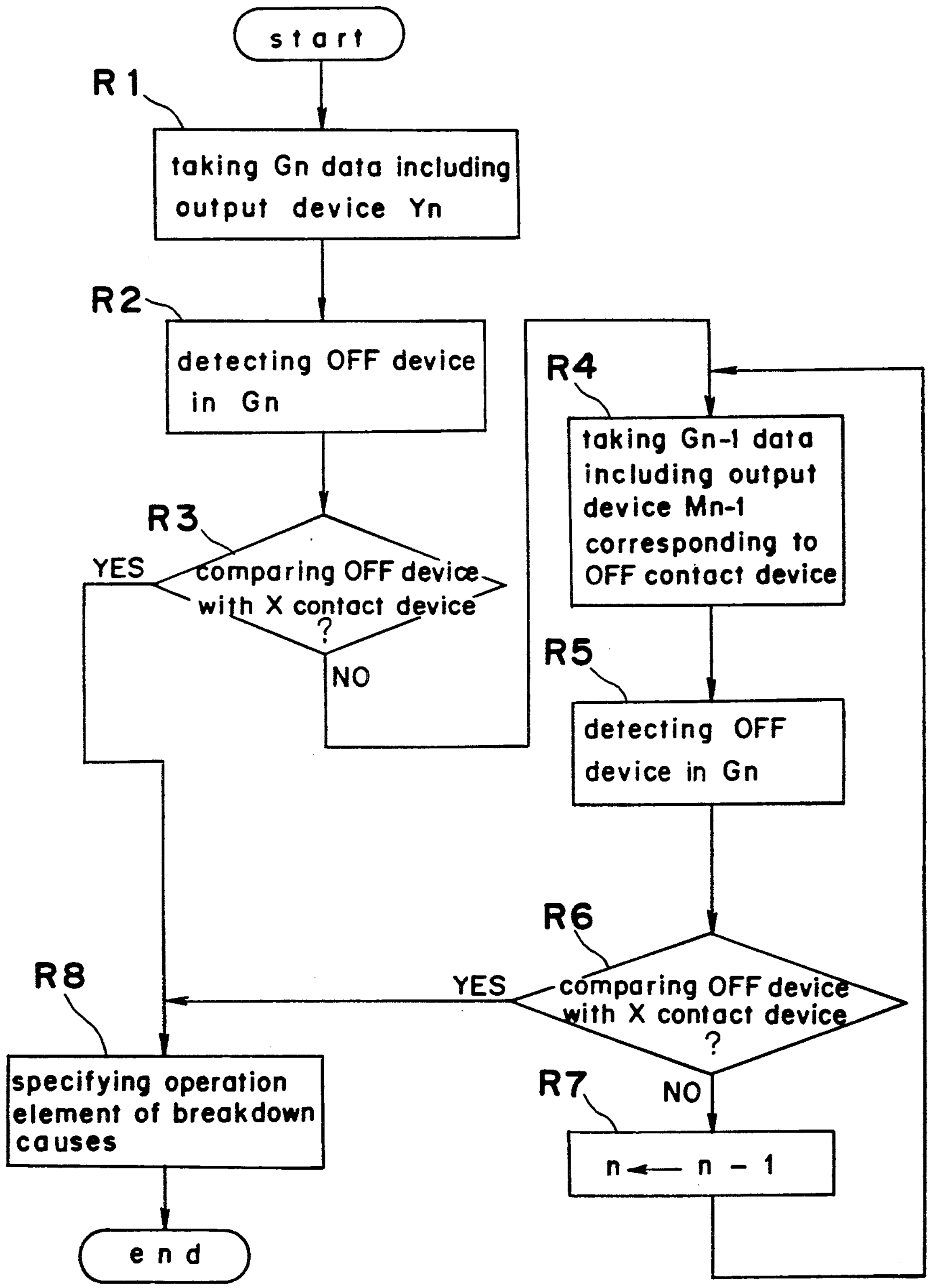
FIG. 24 is a flow-chart for explaining the search for a broken component according to one example of the breakdown diagnosing method of a production line of the present invention.

It will be described now with reference to a flowchart shown in FIG. 24 how CPU 162 specifies the broken component in the device executing the operation step which is determined to include the broken component.

First of all, in the sequential control program for use in the sequential control of the equipment 170, each output device is connected to contact devices to thereby form a set of ladder components called as a ladder component device group, i.e., Gx-2, Gx-1, Gx in FIG. 26. In this state, a portion corresponding to the operation step specified to include the broken component is selected in the sequential control ladder program, whereby data related to the ladder component device group (Gn) including the output means in the OFF state is taken among the selected portion of the sequential control ladder program (step R1). Then, a contact device (OFF device) which is in the OFF state without being connected in parallel to the contact devices in the ON state is detected in the device group Gn (step R2), which is in turn determined whether it is not corresponding to an output device (Mn-1), that is, whether it is an X contact device in the ladder component device group in a precedent stage (Gn-1) (step R3). As a result, in the case where the OFF device is the X contact device, the OFF device is judged to be the broken device, and a corresponding component is specified as the broken component (step R8).

On the other hand, in the case where the OFF device in the ladder component device group Gn is not the X contact device, data of the ladder component device group Gn-1 in the precedent stage including the output device (Mn-1) corresponding to the OFF device is read (step R4), so that an OFF device which is a contact device to be in the OFF state without being connected in parallel to the contact devices in the ON state is detected in the device group Gn-1 (step R5). The OFF device detected in the group Gn-1 is further determined as to whether it is not corresponding to an output device (Mn-2) in a ladder component device group in a precedent stage (Gn-2), i.e., whether or not it is an X contact device (step R6). Consequently, if the OFF device is the X contact device, the OFF device is judged to be a broken device, and a component corresponding to the OFF device is specified as the broken component (step R8).

If the OFF device in the device group Gn-1 is not the X contact device, the variable n is reduced by 1 (step R7), with the flow returning to step R4. The process after step R4 is repeated until the OFF device in the group Gn-1 is decided to be the X contact device in step R6. When the OFF device in the group Gn-1 is decided to be the X contact device in step R6, the flow goes to step R8.

The broken component in the equipment is thus specified. In connection with this specification of the broken component, the detection of the OFF device in the device group Gn carried out in step R2 of the flow-chart of FIG. 24 and the detection of the OFF device in the device group Gn-1 carried out in step R5 of the same flow-chart will be described more in detail with reference to FIGS. 27 and 28. It is to be noted here that the device group Gn is formed, e.g., in such structure as in the ladder component device group Gx shown in FIG. 26, and the device group Gn-1 is formed, e.g., in such structure as in the ladder component device groups Gx-1 and Gx-2 shown in FIG. 26.

Figure 29:
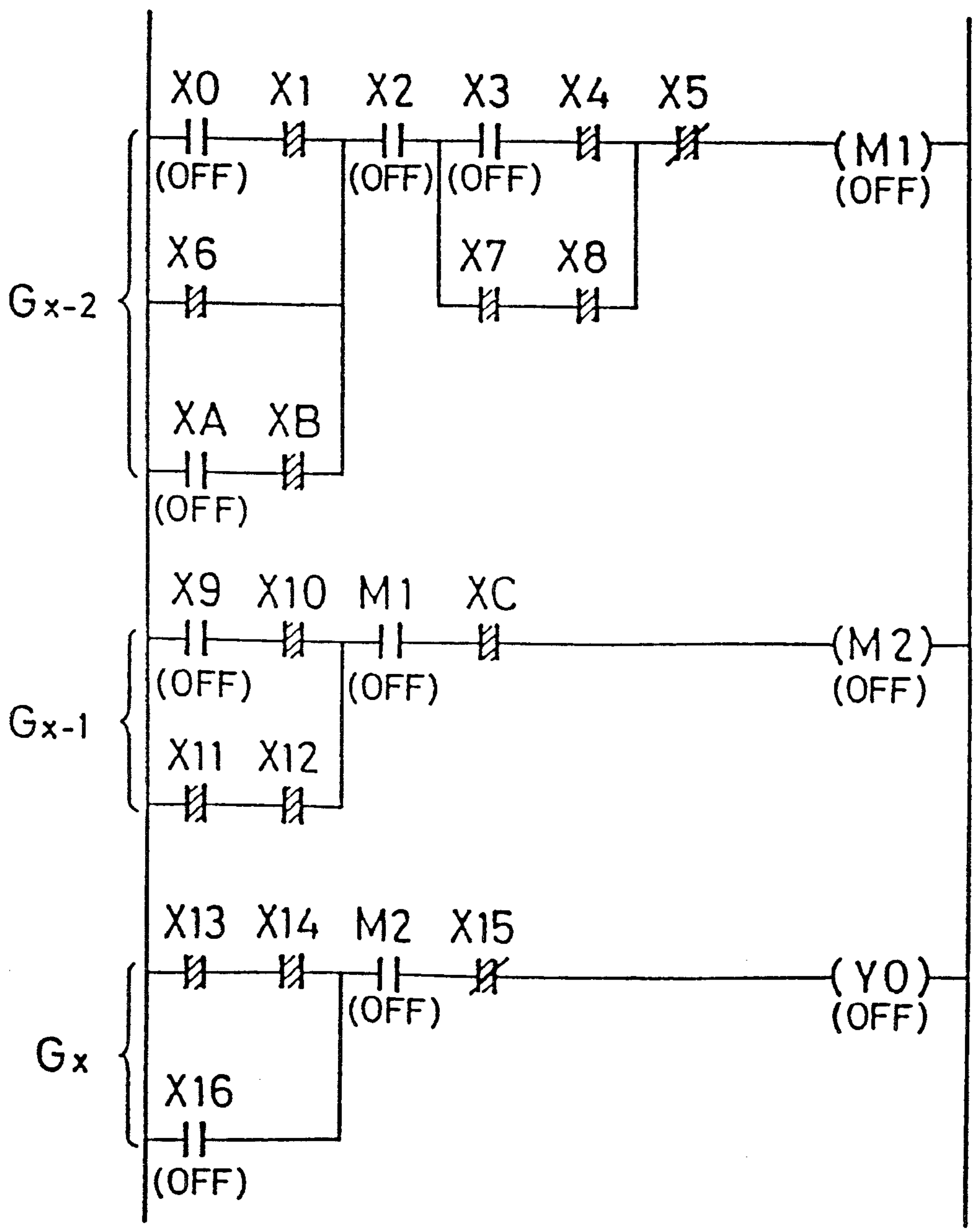

As shown in FIG. 29, in the device group Gn, concretely Gx, and the device group Gn-1, concretely Gx-1 and Gx-2, those hatched are in the ON state, while those not hatched are in the OFF state. When the contact device X2 in the device group Gx-2 is a broken device in the OFF state, then, the output device Y0 in the device group Gx is turned into the OFF state.

Figure 28A:
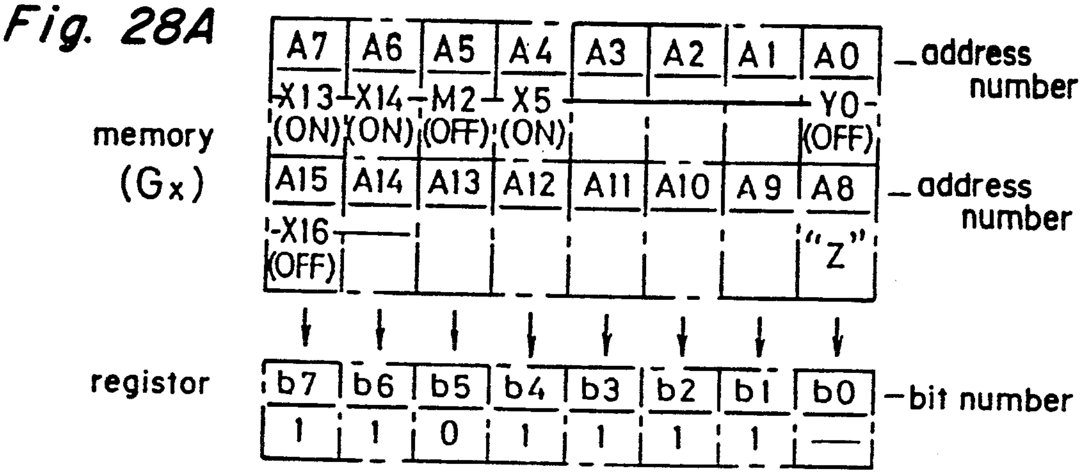

In the first place, for detecting an OFF device in the device group Gn, data of each device in the device group Gn is allotted and stored in a plurality of memory areas each attached with an address number while a ladder pattern is maintained (step S1). At this time, the data of each device is stored "1" when the device is in the ON state, while the data thereof is "0" when the device is in the OFF state. Moreover, a connection between devices is stored as "1". A data "Z" is stored in a memory area with an address number smaller by 7 than the final address number. Therefore, as indicated in FIG. 28A, data of each device is stored from a memory area with an address number A0 (referred to as an address section A0, and the other memory areas will be similarly referred) to an address section A15 for the device group Gx. The data "Z" is to be stored in an address section A8 accordingly.

Then, it is detected whether the data "Z" is stored in the address section A8 (step S2). In the case where the data "Z" is stored in the address section A8, a variable i is set to be 1 (step S3), to obtain data of OR operation ("0" or "1") by the data of address sections Ai and A(i+8). The obtained data is set in a bit of bit number bi in an 8-bit register (step S4).

Subsequently, after the variable i is increased 1 (step S5), it is detected whether the variable becomes 7 (step S6). If the variable i is not 7, the flow returns to step S4 where the OR operation of the data of address sections Ai and A(i+8) is obtained to be set in the bit of bit number bi of the 8-bit register. The above procedure is repeated until the variable i becomes 7. As a result, when the variable i becomes 7, the OR operation data of the address sections Ai and A(i+8) are set in each bit of bit numbers b1–b7 among the bit numbers b0–b7 of the 8-bit register, as shown in FIG. 28A. For the device group Gx, "0" is set only in a bit of bit number b5, and "1" is set in all the other bits.

Next, a bit of bit number bZ set with the OR operation data "0", namely, a bit having bit number b5 in the device group Gx is detected (step S7), and a contact device in which data is stored in the address section A(Z+m8) (m being 0, 1, 2 is detected to be an OFF device (step S8). Therefore, the contact device M2 is detected as the OFF device in the device group Gx.

Meanwhile, as a result of the judgement in step S2, if the data "Z" is not stored in the address section A8, a variable k is set to be 1 (step S9), with an address number A{i+8(1+k)} being stored (step S10). Then, it is detected whether or not the data "Z" is stored in an address section A8(1+k) (step S11). Without the data "Z" stored in the address section A8(1+k), the variable k is increased by 1 (step S12). Thereafter, the flow returns to step S10, so that the address number A{i+8(1+k)} is stored. The procedure is repeated until it is detected that the data "Z" is stored in the address section A8(1+k).

Then, with the variable i being set 1 (step S13), the OR operation ("0" or "1") of the data of address sections Ai and A(i+8) and the data in the memory area having the address number A{i+8(1+k)} stored in step S10 is obtained and set in a bit of bit number bi of the 8-bit register (step S14).

Subsequently, after the variable i is increased by 1 (step S15), it is detected whether or not the variable i becomes 7 (step S16). In the case where the variable i is not 7, the flow returns to step S14 where the OR operation of the data in address sections Ai and A(i+8) and the data in the memory area having the address number A{i+8(1+k)} stored in step S10 is obtained and set in a bit of bit number bi in the 8-bit register. The above procedure is repeated until the variable i reaches 7. When the variable i becomes 7, the flow advances to step S7 mentioned earlier.

When the device group Gx is the device group Gn, steps S9–S16 are never executed.

Figure 27:
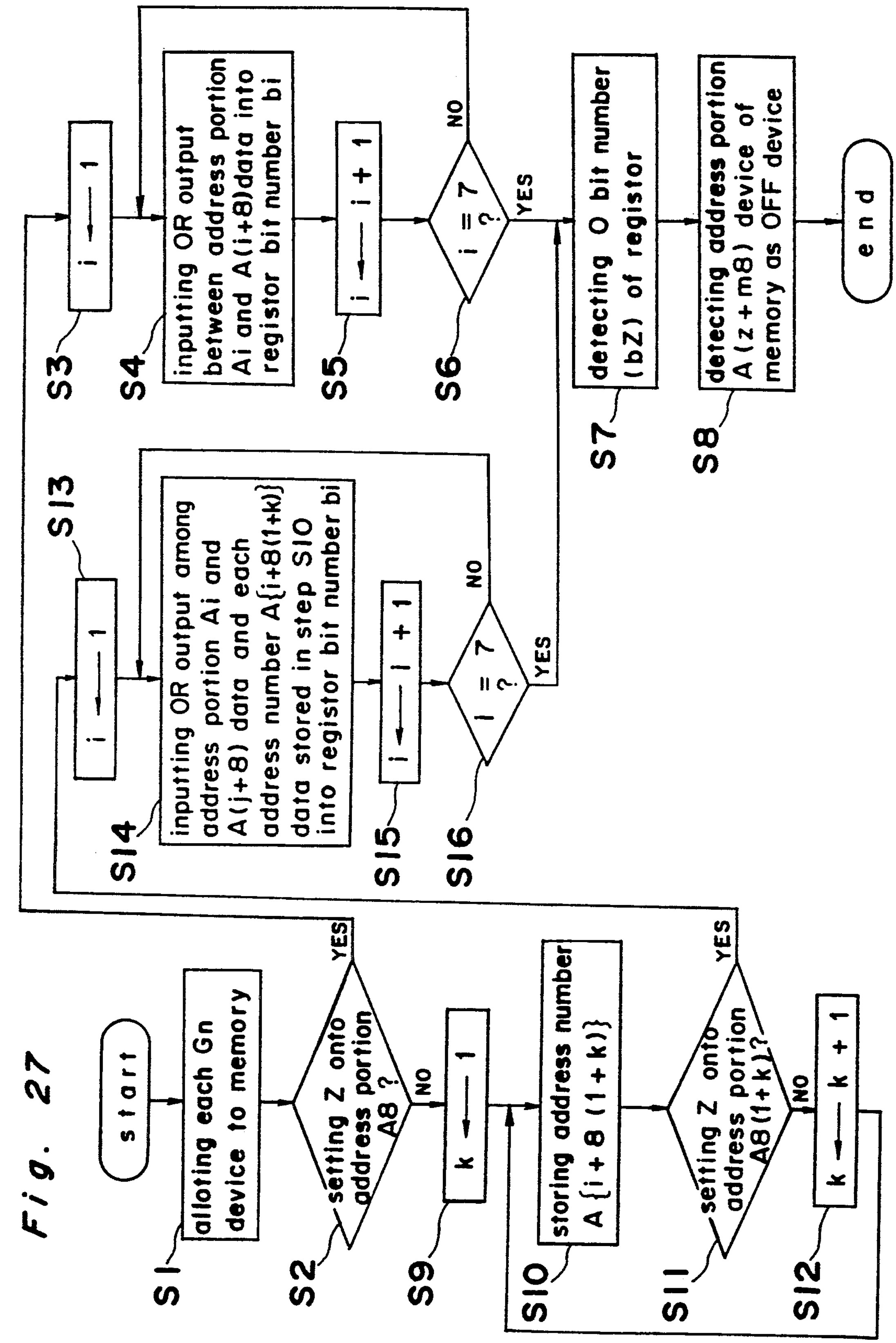
FIGS. 27, 28 and 29 are respectively a flow-chart, a memory diagram and a ladder diagram for explaining a specific process according to the one example of the breakdown diagnosing method.
Figure 28B:
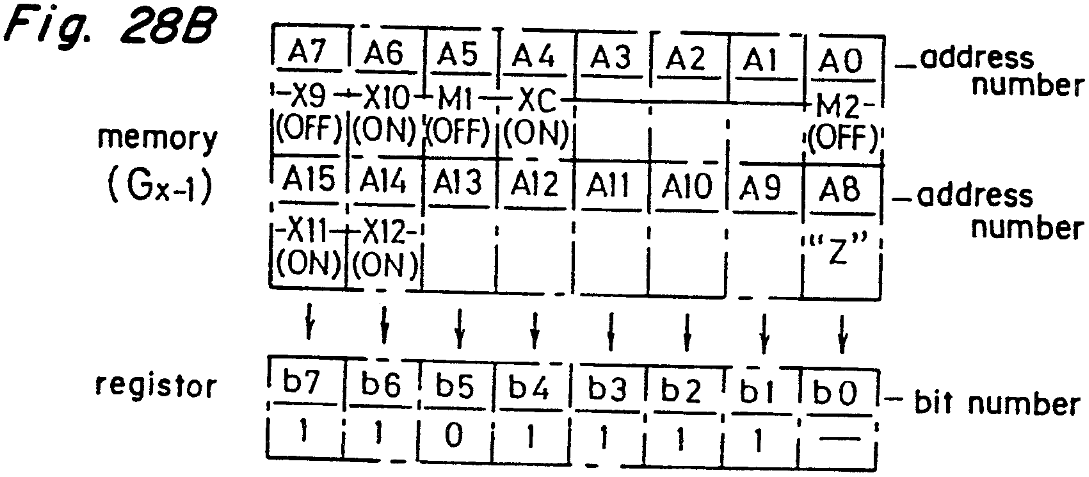

Moreover, an OFF device in the device group Gn-1 is detected in accordance with a similar flow-chart as shown in FIG. 27. When the device groups Gx-1 and Gx-2 are the device group Gn-1, first of all, data of each device for the device group Gx-1 is allotted and stored in address sections A0–A15 as shown in FIG. 28B in a step corresponding to step S1 indicated in the flow-chart of FIG. 27. In this case also, since the address section A8 is stored with the data "Z", the OR operation of the data of address sections Ai and A(i+8) is set in a bit of bit number bi of the 8-bit register in a step corresponding to step S4 of FIG. 27, which is repeated until the variable i becomes 7. As indicated in FIG. 28B, when the variable i becomes 7, the OR operation of the data of address sections Ai and A(i+8) is set in each bit of bit numbers b1–b7 among b0–b7 in the 8-bit register. Accordingly, the bit set with the OR operation data "0" has a bit number bZ, namely, b5 for the device group Gx-1, and therefore "0" is set only in the bit having bit number b5, and "1" is set in the other bits in the 8-bit register.

Consequently, in a step corresponding to step S8 of FIG. 27, the contact device in which data is stored in the address section A(Z+m8) (m being 0, 1, 2 . . . ), that is, the contact device M1 in which data is stored in the address section A5 is detected to be an OFF device.

Figure 28C:
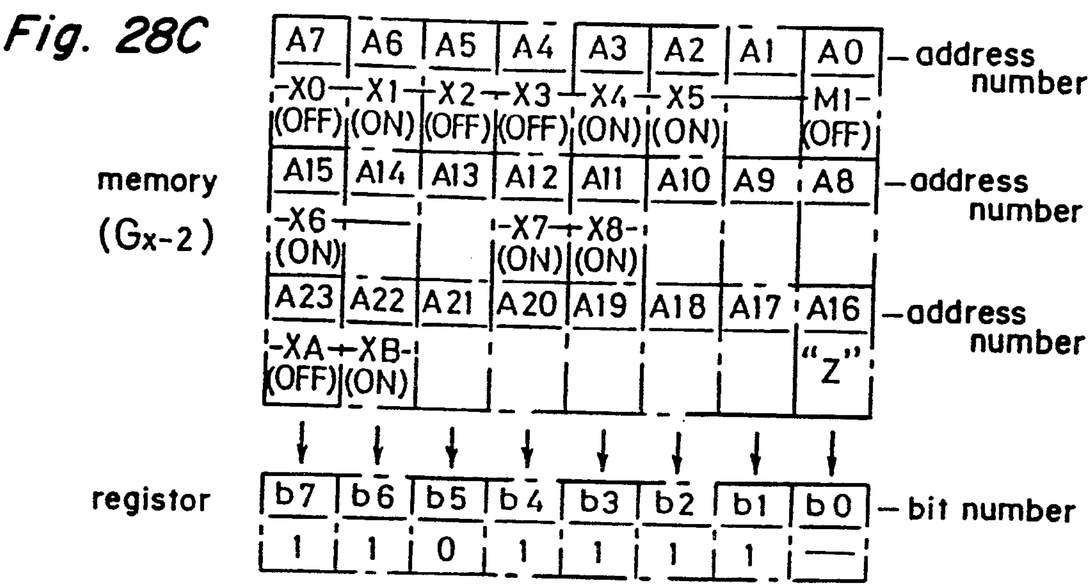

As for the device group Gx-2, in a step corresponding to step S1 of FIG. 27, data of each device is assigned and stored in address sections A0–A23 as shown in FIG. 28C. In this case, since the data "Z" is stored in the address section A16, not in the address section A8, the OR operation of the data in address sections Ai and A(i+8) and the data of address number A(i+16) is set in a bit of bit number bi in a step corresponding to step S14 of FIG. 27, which is repeated until the variable i becomes 7. Therefore, when the variable i becomes 7, as shown in FIG. 28C, the OR operation of the data in address sections Ai and A(i+8) and the data of address number A(i+16) is set in each bit of bit numbers b1–b7 among b0–b7 in the 8-bit register. Accordingly, the bit in which the OR operation data "0" is set has a bit number bZ, i.e., b5, and only the bit of bit number b5 is set with "0" and the other bits in the 8-bit register are set with "1" in the device group Gx-2.

Thus, in a step corresponding to step S8 of FIG. 27, the contact device in which data is stored in the address section A(Z+m8) (m being 0, 1, 2 . . . ), namely, the contact device X2 in which data is stored in the address section A5 is detected to be an OFF device.

As is clear from the above description, according to the breakdown diagnosing method of the present invention, when an equipment which is controlled to sequentially execute, in accordance with a sequential control ladder program, a plurality of operation steps in each operation block, containing the maximum unit of a series of operations independently executed from the start to finish thereof at a normal state breaks, down with a specific output means being turned OFF, a contact device in each device group which is composed of an output device and contact devices connected to the output device to thereby form a set of ladder components and which device is in the OFF state without being connected in parallel to the contact devices in the ON state is detected. When the detected contact device is decided not to correspond to an output device in a device group in a precedent stage, a broken component is specified. Therefore, when it so happens that the equipment under sequential control breaks down, the component causing the breakdown can be promptly and properly searched by the breakdown diagnosing method according to the present invention.

What is claimed is:

1. A breakdown diagnosing method of equipment in a production line having a plurality of stations which are sequentially controlled to execute a plurality of operations in a predetermined order, comprising the steps of:

dividing the operations executed by said plurality of stations into a plurality of operation blocks, each operation block defining discrete series of operations which are executed among the plurality of stations independently from a discrete series of operations defined by each other operation block during a normal operating state of said equipment;

dividing each of said plurality of operation blocks into a plurality of operation steps, measuring an operation time expended from a start to a completion of a series of operation steps of each operation block;

storing an indication of the completion of each operation step in said each operation block;

comparing said measured operation time with a reference operation time for each operation block, and specifying an abnormal operation step in any of said operation blocks in response to an excessive time difference time obtained in said comparing step and with reference to the operation step completion indication stored in said storing step.

2. The breakdown diagnosing method as defined in claim 1, wherein said measuring step includes measuring an operating time duration from a start to completion of each of the operation blocks.

3. The breakdown diagnosing method as defined in claim 1, wherein said measuring step includes counting in sequence the completion of said operation steps in each operation block, and storing a corresponding count number.

4. The breakdown diagnosing method as defined in claim 1, wherein said measuring step includes a plurality of steps for sequentially operating devices, each of said steps being operated independently with respect to each other.

5. The breakdown diagnosing method as defined in claim 1, wherein said measuring step includes incrementing the count number upon detecting both of an outerlock signal for executing an operation step and an operation command signal.

6. A breakdown diagnosing method of equipment in a production line having a plurality of stations which are sequentially controlled to execute a plurality of operations in a predetermined order, comprising the steps of:

defining a plurality of discrete operation zones each comprising a subset of said plurality of stations and each for executing a discrete series of operations independently from a discrete series of operations of each other operation zone during a normal operating state of said equipment;

dividing at least one of said plurality of operation zones into a plurality of operation blocks, each operation block defining a series of discrete operating steps executed within a corresponding operating zone independently from a series of discrete operating steps defined by each other operation block, measuring an operation time expended from a start to a completion of a series of operation blocks in each operation zone;

storing an indication of a completion of each operation blocks in each operation zone, comparing said measured operation time with a reference operation time for each operation zone, and specifying an abnormal operation block in any of said operation zones in response to an excessive time difference obtained in said comparing step and with reference to the operation block completion indication stored in said storing step.

7. The breakdown diagnosing method as defined in claim 6, wherein said measuring step includes measuring an operating time duration from a start to completion of each of the operation zones.

8. The breakdown diagnosing method as defined in claim 6, wherein said measuring step includes counting in sequence the completion of said operation blocks in said each operation zone, and storing a corresponding count number.

9. The breakdown diagnosing method as defined in claim 6, wherein said measuring step includes a plurality of steps for sequentially operating devices, each of said steps being operated independently with respect to each other.

10. The breakdown diagnosing method as defined in claim 8, wherein said measuring step includes incrementing the count number upon detecting both of an outerlock signal for executing an operation block and an operation command signal.

11. The breakdown diagnosing method of equipment in at least one production line which is sequentially controlled to execute a plurality of operations in a predetermined order, comprising the steps of:

dividing the production line into a plurality of operation zones each defining a discrete series of operations which are executed independently from a series of discrete operations defined by each other operation zone during a normal operating state of said equipment;

measuring an operation time expended from a start to a completion of a series of operation zones in said production line;

storing an indication of a completion of each operation zones in said production line, comparing said measured operation time with a reference operation time for said production line, and specifying an abnormal operation zone in said production line in response to an excessive time difference obtain in said comparing step and with reference to the operation zone completion indication stored in said storing step.

12. The breakdown diagnosing method as defined in claim 11, wherein said measuring step includes measuring an operating time duration from a start to a completion in said production line.

13. The breakdown diagnosing method as defined in claim 11, wherein said measuring step includes counting in sequence the completion of said operation zones in said production line, and storing a corresponding count number.

14. The breakdown diagnosing method as defined in claim 11, wherein said production line includes a plurality of steps for sequentially operating devices, each of said steps being operated independently with respect to each other.

15. The breakdown diagnosing method as defined in claim 13, wherein said counting step includes incrementing the count number upon detecting both of an outerlock signal for executing an operation zone and an operation command signal.

16. The breakdown diagnosing method of an equipment in a production line, comprising the steps of:

dividing various operations to be carried out by said equipment in said production line into a plurality of operation groups each as a unit of a series of operations independently carried out from the start to finish thereof at a normal state;

dividing each of said plurality of operation groups into a plurality of operation blocks; and sequentially executing said plurality of operation blocks in said each operation group in a predetermined order, the improvement further comprising the steps of:

measuring the operation time spent from the start to finish of a series of operation blocks in said each group;

comparing said measured operation time with a reference operation time for said group, to thereby diagnose the presence or absence of an abnormality in said each group; and specifying a broken group and a broken block from contents of a memory means provided in said each group for storing the completion of operation in each block.

17. A method for diagnosing a breakdown in a production line, comprising the steps of:

classifying operations to be carried out by output factors constituting an operating system of equipment in said production line into a plurality of operating steps;

sorting said operating steps into a plurality of blocks each constituted of a group of operating steps for executing a series of said operating steps from the start to finish thereof independently;

measuring the operating time for said each block from the start to finish of said series of operating steps; and comparing said measured operating time with a reference operating time for said block, to thereby diagnose the presence or absence of an abnormality in said each block, the improvement further comprising the steps of:

measuring the output time for each operating step constituting said block from the start to finish of said operating step;

comparing said measured output time with a reference output time for said operating step;

to thereby diagnose the presence or absence of an abnormality for said each step, whereby the presence or absence of breakdown in said operating system of equipment can be diagnosed, and the position of said breakdown can be specified.

18. A breakdown diagnosing method of an equipment in a production line, comprising the steps of:

dividing various operations to be carried out by said equipment in said production line into a plurality of operation blocks as the maximum unit of a series of operations independently carried out from the start to finish thereof at a normal state;

dividing each of said plurality of operation blocks into a plurality of operation steps; and controlling said equipment to sequentially execute said plurality of operation steps in said each operation block in accordance with a sequential control ladder program, the improvement further comprising the step of:

forming a ladder component device group by each output device and contact devices connected to said output device in said sequential control ladder program to thereby form a set of ladder components, whereby, when said equipment breaks down to turn OFF a specific output means, a contact device in said ladder component device group including an output device corresponding to said specific output means and which is in the OFF state without being connected in parallel to a contact device in the ON state is detected, and when said detected contact device in the OFF state is corresponding to an output device in a ladder component device group in a precedent stage, a contact device in the OFF state without being connected in parallel to a contact device in the ON state in said ladder component device group in the precedent stage is detected, and when said detected contact device is not corresponding to an output device in a ladder component device group in a precedent stage, said contact device is judged to be a component causing the breakdown.

* * * * *